US011893313B2

(12) United States Patent
Rejeb Sfar et al.

(10) Patent No.: US 11,893,313 B2
(45) Date of Patent: Feb. 6, 2024

(54) INTERACTIVE OBJECT SELECTION

(71) Applicant: DASSAULT SYSTEMES, Velizy Villacoublay (FR)

(72) Inventors: Asma Rejeb Sfar, Velizy-Villacoublay (FR); Tom Durand, Velizy-Villacoublay (FR); Malika Boulkenafed, Velizy-Villacoublay (FR)

(73) Assignee: DASSAULT SYSTEMES, Velizy Villacoublay (FR)

( * ) Notice: Subject to any disclaimer, the term of this patent is extended or adjusted under 35 U.S.C. 154(b) by 523 days.

(21) Appl. No.: 17/124,452

(22) Filed: Dec. 16, 2020

(65) Prior Publication Data

US 2021/0192254 A1    Jun. 24, 2021

(30) Foreign Application Priority Data

Dec. 16, 2019  (EP) .................................... 19306656

(51) Int. Cl.
*G06F 30/10* (2020.01)
*G06T 7/11* (2017.01)
*G06N 3/08* (2023.01)

(52) U.S. Cl.
CPC .............. *G06F 30/10* (2020.01); *G06N 3/08* (2013.01); *G06T 7/11* (2017.01);
(Continued)

(58) Field of Classification Search
CPC ......... G06F 30/10; G06F 18/214; G06N 3/08; G06N 3/045; G06T 7/11; G06T 2207/10028; G06T 2207/20081; G06T 2207/20084; G06T 2207/20101; G06T 17/20
See application file for complete search history.

(56) References Cited

U.S. PATENT DOCUMENTS 10,970,518 B1\*  4/2021  Zhou ......................... G06T 7/73
2011/0002531 A1\*  1/2011  Heisele ................. G06F 18/214
382/154

(Continued)

OTHER PUBLICATIONS

Kun Liu, et al., "A New Framework for Interactive Segmentation of Point Clouds",—Int. Arch. Photogramm. Remote Sens. Spatial Inf. Sci. 2014, vol. XL-5, ISPRS Technical Commission V Symposium, Jun. 23-25, 2014, Riva del Garda, Italy.

(Continued)

*Primary Examiner* — Bobbak Safaipour
(74) *Attorney, Agent, or Firm* — Oblon, McClelland, Maier & Neustadt, L.L.P.

(57) ABSTRACT

A computer-implemented method of machine-learning including obtaining a dataset of 3D point clouds. Each 3D point cloud includes at least one object. Each 3D point cloud is equipped with a specification of one or more graphical user-interactions each representing a respective selection operation of a same object in the 3D point cloud. The method further includes teaching, based on the dataset, a neural network configured for segmenting an input 3D point cloud including an object. The segmenting is based on the input 3D point cloud and on a specification of one or more input graphical user-interactions each representing a respective selection operation of the object in the 3D point cloud.

16 Claims, 7 Drawing Sheets

(52) U.S. Cl.
CPC ............ *G06T 2207/10028* (2013.01); *G06T 2207/20081* (2013.01); *G06T 2207/20084* (2013.01); *G06T 2207/20101* (2013.01)

(56) References Cited

U.S. PATENT DOCUMENTS

| | | | | |
|---|---|---|---|---|
| 2020/0117898 | A1* | 4/2020 | Tian | G06F 3/04815 |
| 2020/0327727 | A1* | 10/2020 | Lieutier | G06T 7/50 |
| 2021/0019453 | A1* | 1/2021 | Yang | G06N 5/01 |
| 2021/0056324 | A1* | 2/2021 | Chen | G06V 10/82 |
| 2022/0327779 | A1* | 10/2022 | Inoue | G06T 19/00 |
| 2022/0358717 | A1* | 11/2022 | Wang | G06T 17/00 |
| 2023/0014934 | A1* | 1/2023 | Mezghanni | G06T 17/20 |
| 2023/0186476 | A1* | 6/2023 | Ghazvinian Zanjani | ............ G06V 10/82 706/20 |

OTHER PUBLICATIONS

David E. Rumelhart, et al., Parallel Distributed Processing, Explorations in the Microstructure of Cognition, vol. 1: Foundations, Visual Cognition, edited by Steven Pinker.

David Sedlacek, et al., "Graph Cut Based Point-Cloud Segmentation for Polygonal Reconstruction", ISVC 2009, Part II, LNCS 5876, pp. 218-227, 2009.

Xinlong Wang, et al., "Associatively Segmenting Instances and Semantics in Point Clouds" arXiv:1902.09852v2 [cs.CV] Feb. 28, 2019.

Xiangyu Yue, et al., "A LiDAR Point Cloud Generator: from a Virtual World to Autonomous Driving", arXiv:1804.00103v1 [cs.CV] Mar. 31, 2018.

European Search Report dated Apr. 14, 2020, in corresponding application No. EP19306656.0.

Iro Armeni, et al., "3D Semantic Parsing of Large-Scale Indoor Spaces", http://buildingparser.stanford.edu/.

Andreas Geiger and Philip Lenz and Raquel Urtasun, "Are we ready for Autonomous Driving? The KITTI Vision Benchmark Suite", Andreas Geiger and Philip Lenz, Karlsruhe Institute of Technology, {geiger,lenz}@kit.edu, Raquel Urtasun, Toyota Technological Institute at Chicago, rurtasun@ttic.edu.

Aleksey Golovinskiy, and Thomas Funkhouser, "Min-Cut Based Segmentation of Point Clouds", ICCV Workshops, 2009 . . . .

Timo Hackel, et al,. "semantic3d.net: A New Large-Scale Point Cloud Classification Benchmark", Commission II, WG II/6, arXiv:1704.03847v1 [cs.CV] Apr. 12, 2017.

Yangyan Li, et al., "PointCNN: Convolution on X-Transformed Points", arXiv:1801.07791v5 [cs.CV] Nov. 5, 2018.

Riccardo Monica, Jacopo Aleotti, and Michael Zillich, Markus Vincze, "Multi-Label Point Cloud Annotation by Selection of Sparse Control Points", 2017 International Conference on 3D Vision (3DV), XP33353200A.

Bernie Wang, et al., "LATTE: Accelerating LiDAR Point Cloud Annotation via Sensor Fusion, One-Click Annotation, and Tracking", 2019 IEEE Intelligent Transportation Systems Conference (ITSC), pp. 265-272, XP33668327A.

Charles R. Qi, et al., "PointNet: Deep Learning on Point Sets for 3D Classification and Segmentation", arXiv:1612.00593v1 [cs.CV] Dec. 2, 2016. XP80736277A.

* cited by examiner

INTERACTIVE OBJECT SELECTION

CROSS-REFERENCE TO RELATED APPLICATIONS

This application claims priority under 35 U.S.C. § 119 or 365 to European Application No. 19306656.0, filed Dec. 16, 2019. The entire contents of the above application(s) are incorporated herein by reference.

FIELD

The disclosure relates to the field of computer programs and systems, and more specifically to a method, system and program of machine-learning.

BACKGROUND

A number of systems and programs are offered on the market for the design, the engineering and the manufacturing of objects. CAD is an acronym for Computer-Aided Design, e.g. it relates to software solutions for designing an object. CAE is an acronym for Computer-Aided Engineering, e.g. it relates to software solutions for simulating the physical behavior of a future product. CAM is an acronym for Computer-Aided Manufacturing, e.g. it relates to software solutions for defining manufacturing processes and operations. In such computer-aided design systems, the graphical user interface plays an important role as regards the efficiency of the technique. These techniques may be embedded within Product Lifecycle Management (PLM) systems. PLM refers to a business strategy that helps companies to share product data, apply common processes, and leverage corporate knowledge for the development of products from conception to the end of their life, across the concept of extended enterprise. The PLM solutions provided by Dassault Systèmes (under the trademarks CATIA, ENOVIA and DELMIA) provide an Engineering Hub, which organizes product engineering knowledge, a Manufacturing Hub, which manages manufacturing engineering knowledge, and an Enterprise Hub which enables enterprise integrations and connections into both the Engineering and Manufacturing Hubs. All together the system delivers an open object model linking products, processes, resources to enable dynamic, knowledge-based product creation and decision support that drives optimized product definition, manufacturing preparation, production and service.

In this context and other contexts, segmenting a point cloud is gaining wide importance. The following papers relate to point cloud segmentation and are referred to hereunder:

[1] Aleksey Golovinsky, Thomas Funkhouser. "Min-Cut Based Segmentation of Point Clouds"-ICCV Workshops, 2009,

[2] Kun Liu, Jan Boehm. "A New Framework or Interactive Segmentation of Point Clouds"—Int. Arch. Photogramm. Remote Sens. Spatial Inf. Sci. 2014, and

[3] Sedlacek D., Zara J. "Graph Cut Based Point-Cloud Segmentation for Polygonal Reconstruction"—ISVC 2009.

These methods suffer from a lack of efficiency, robustness, and generalization power.

Within this context, there is a need for an improved method of machine-learning for point cloud segmentation.

SUMMARY

It is therefore provided a computer-implemented method of machine-learning. The method comprises providing a dataset of 3D point clouds. Each 3D point cloud comprises at least one object. Each 3D point cloud is equipped with a specification of one or more graphical user-interactions. Each graphical user-interaction represents a respective selection operation of a same object in the 3D point cloud. The method further comprises learning, based on the dataset, a neural network configured for segmenting an input 3D point cloud comprising an object. The segmenting is based on the input 3D point cloud and on a specification of one or more input graphical user-interactions. Each input graphical user-interaction represents a respective selection operation of the object in the 3D point cloud.

The method may comprise one or more of the following:
  the providing of the dataset of 3D point clouds comprises:
    providing the 3D point clouds and, for each 3D point cloud, information about location of said same object in the 3D point cloud; and
    for each 3D point cloud:
      determining the specification by simulating each graphical user-interaction of the one or more graphical user-interactions; and
      equipping the 3D point cloud with the specification of the one or more graphical user-interactions;
  each graphical user-interaction of the one or more graphical user-interactions corresponds to one or more seed locations each defined over the 3D point cloud, and the simulating of the graphical user-interaction comprises determining the one or more seed locations;
  the one or more graphical user-interactions comprise a first graphical user-interaction for selecting said same object and corresponding to one or more first seed locations each defined over said same object;
  the determining of the one or more seed locations comprises spreading the one or more first seed locations over said same object;
  for at least one 3D point cloud, the one of more graphical user-interactions further comprise a second graphical user-interaction for discarding a region outside of said same object and corresponding to one or more second seed locations each defined outside said same object;
  the equipping of the 3D point cloud comprises, based on the simulating of each graphical user-interaction, adding to each point of the 3D point cloud a coordinate quantifying an intensity of the selection operation at the point; and/or
  each graphical user interaction of the one or more graphical user-interactions is for selecting said same object or for discarding a region outside of said same object, and for each point of the 3D point cloud the adding of the coordinate comprises:
    setting the coordinate to an initial value;
    for each graphical user-interaction for selecting said same object, increasing the coordinate according to a closeness between the graphical user-interaction and the point; and
    for each graphical user-interaction for discarding a region outside of said same object, decreasing the coordinate according to a closeness between the graphical user-interaction and the point.

It is further provided a neural network learnable according to the method, for example a neural network having been learnt according to the method.

It is further provided a computer-implemented method of use of the neural network. The method of use comprises providing a 3D point cloud, the 3D point cloud comprising an object. The method of use further comprises one or more iterations of: performing a selection operation of the object by performing one or more graphical user-interactions, and, by applying the neural network, segmenting the 3D point cloud based on the 3D point cloud and on a specification of the one or more graphical user-interactions.

The method of use may comprise one or more of the following:

the method further comprises, after the performing of the selection operation and before the applying of the neural network:

determining the specification by determining, for each graphical user-interaction of the one or more graphical user-interactions, positions of one or more seed locations defined by the graphical user-interaction; and equipping the 3D point cloud with the specification, the equipping comprising adding to each point of the 3D point cloud a coordinate quantifying an intensity of the selection operation at the point; and/or the one or more graphical user-interactions comprise one or more of:

performing one or more clicks over the object;
performing a stroke over the object;
defining a bounding box over the object and/or around the object;
performing one or more clicks outside the object; and/or
performing a stroke outside the object.

It is further provided a computer program comprising instructions for performing the method and/or the method of use.

It is further provided a device comprising a data storage medium having recorded thereon the computer program and/or the neural network.

The device may form or serve as a non-transitory computer-readable medium, for example on a SaaS (Software as a service) or other server, or a cloud based platform, or the like. The device may alternatively comprise a processor coupled to the data storage medium. The device may thus form a computer system in whole or in part (e.g. the device is a subsystem of the overall system). The system may further comprise a graphical user interface coupled to the processor.

BRIEF DESCRIPTION OF THE DRAWINGS

Embodiments will now be described, by way of non-limiting example, and in reference to the accompanying drawings, where.

DETAILED DESCRIPTION

Figure 1:
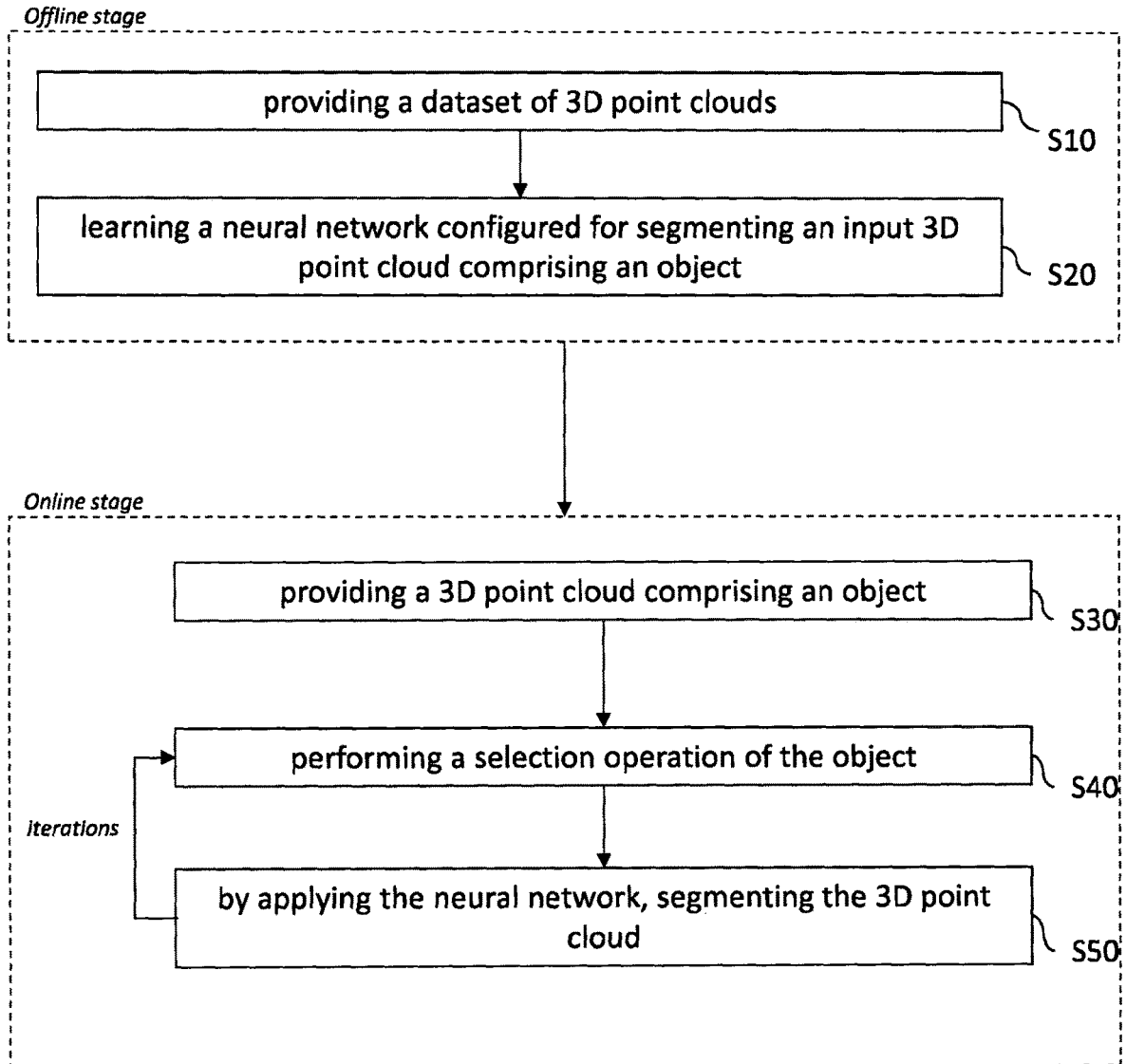
FIGS. 1, 2, 3, 4, 5, 6, 7, 8, 9, 10, 11, 12, 13, 14 and 15 illustrate the methods.

It is described a computer-implemented method of machine-learning. The method comprises providing a dataset of 3D point clouds. Each 3D point cloud comprises at least one object. Each 3D point cloud is equipped with a specification of one or more graphical user-interactions each representing a respective selection operation of a same object in the 3D point cloud. The method further comprises learning, based on the dataset, a neural network configured for segmenting an input 3D point cloud comprising an object. The segmenting is based on the input 3D point cloud and on a specification of one or more input graphical user-interactions each representing a respective selection operation of the object in the 3D point cloud. The method may be referred to as the learning method.

This constitutes an improved method of machine-learning for point cloud segmentation.

Notably, the learning method learns a neural network configured for segmenting an input 3D point cloud comprising an object. This amounts to say that the learning method uses machine-learning, e.g. deep learning, in the context of point cloud segmentation, which is a non-conventional approach. Notably, this allows to benefit from the well-known advantages of machine-learning, e.g. of deep learning, in a new technical context. Indeed, as explained in the present disclosure, this approach has been successfully tested.

The neural network is learnt based on the provided dataset of 3D point clouds, each 3D point cloud of the dataset being equipped with the specification of one or more user-interactions each representing a respective selection operation of the same object in the 3D point cloud. In other words, for each 3D point cloud, the 3D point cloud comprises at least one object, referred to as "the same object" or "said same object", and each respective one of the one or more graphical user-interactions represents a respective selection operation of this same object. The provided dataset may also be referred to as the training dataset. This training dataset is thus made of 3D point clouds each equipped with the specification, the latter specifying a selection operation of said same object through one or more graphical user-interactions. This amounts to say that the training dataset comprises pairs of 3D point clouds and data specifying an object selection through graphical user-interaction in each 3D point cloud. Learning the neural network on such a training dataset allows the neural network to perform segmentation of an input 3D point cloud based only on the input 3D point cloud and on a specification of an input object selection through graphical user-interaction on the 3D point cloud. In other words, the training dataset allows learning of the neural network in such a way that it only needs information about the location of an object on a 3D point cloud and about a selection of this object through graphical user-interaction to segment the object. Thus, the training dataset allows learning of the neural network in such a way that it performs a 3D point cloud segmentation in an efficient and simple manner. Furthermore, the segmentation only relies on information about the location of an object on a 3D point cloud and about a selection of this object through graphical user-interaction. For example, it does not rely on further specifications, such as specification of the object category/type/class. Indeed, as further discussed hereinafter, each point of each 3D point cloud of the training dataset may comprise a single annotation as "object" (i.e. the point belongs to an object, for example said same object) or "background" (i.e. the point belongs to the background), i.e. and no further annotation, e.g. indicating an object category (e.g. such as a chair) for the point. Thus, the neural network is agnostic to the type of the objects in the input 3D point cloud when segmenting it. Said in yet other words, the neural network can extract any type of object from an input 3D point cloud, and not only an object of a specific type (e.g. a chair). This makes the neural network robust.

As further discussed hereinafter, any 3D point cloud herein may be synthetically obtained (e.g. through virtual scan simulation or CAD/mesh conversion) or may alternatively stem from physical measurements (e.g. 3D scans) performed on the real world. In other words, the neural network is agnostic to the type of 3D point clouds it has to segment, which makes the neural network robust.

Moreover, besides being configured to segment a 3D point cloud, the neural network is in fact configured for interactive segmentation of the 3D point cloud. Indeed, the neural network is learnt notably based on specifications of object selection by graphical user-interaction, which allows the neural network to segment an input 3D point cloud by detecting object selection by graphical user-interaction on the input 3D point cloud. In other words, and as discussed in further details hereinafter for the method of use, the neural network allows the user to graphically select an object on an input 3D point cloud and then automatically obtain a segmentation of the input 3D point cloud based on the selection, by applying the neural network. This allows for a segmentation with a reduced burden on the user, as the user need not to perform numerous and/or complex physical actions: simple, usual, and/or not physically tiring graphical interactions with a machine suffice. The learning method thus provides an ergonomically improved solution for interactively segmenting the 3D point cloud.

It is further provided a neural network learnable according to the method, for example a neural network having been learnt according to the method. The neural network is thus configured for segmenting an input 3D point cloud comprising an object. The segmenting is based on the input 3D point cloud and on a specification of one or more input graphical user-interactions. Each graphical user-interaction represents a respective selection operation of the object in the 3D point cloud. Since the neural network learnable according to the method, its segmenting is particularly efficient and has a certain generalization power. For example, the segmenting is agnostic to the type of 3D point cloud and to the type of objects comprised in it, as previously discussed.

It is further provided a computer-implemented method of use of the neural network. The method of use comprises providing a 3D point cloud comprising an object. The method of use further comprises one or more iterations of: performing a selection operation of the object by performing one or more graphical user-interactions, and, by applying the neural network, segmenting (e.g. automatically) the 3D point cloud based on the 3D point cloud and on a specification of the one or more graphical user-interactions. The method of use may be referred to as "the segmenting method".

The segmenting method allows for interactive segmentation in an ergonomically improved way. Indeed, as previously discussed, the neural network is learnt in such a way that the user need only perform object selection by graphical interaction on a 3D point cloud to segment it: the user performs the object selection, then by application of the neural network, the 3D point cloud is (e.g. automatically) segmented. Should the user wish to perform a further segmentation and/or improve the level of details of an already performed segmentation, the user need only perform another object selection by graphical user interaction, and then by application of the neural network, another segmentation is (e.g. automatically) made, and so on. In other words, the segmenting method allows an interactive (and possibly iterative) segmentation of an input 3D point cloud. The segmentation is moreover ergonomic, as it does not yield much burden on the user. The user is indeed only required to perform graphical interactions, e.g. simple, usual and/or not tiring ones, such as clicking, drawing a stroke and/or drawing/defining a bounding box. For example these graphical interactions may be performed with a haptic device, e.g. a mouse and/or a touch-based haptic device (e.g. a touch-screen or a touch-pad), as further discussed hereinafter. Furthermore, as the neural network is agnostic to the type of 3D point cloud and to the object category/class/type, the segmentation may be performed on any type of 3D point cloud, comprising any type of object.

The learning method and the segmenting method may be performed independently, e.g. by different users and/or on different computers. Alternatively, they may be integrated into a same computer-implemented process. The process is now discussed with reference to FIG. 1, which shows a flowchart of an example of the process.

The process comprises an offline stage, which integrates the learning method. The offline stage comprises the providing S10 of a dataset of 3D point clouds according to the learning method. The offline stage further comprises the learning S20 of the neural network configured for segmenting an input 3D point cloud comprising an object according to the learning method. The offline stage may further comprise storing the learnt neural network, e.g. on a memory, e.g. for use in the online stage of the process, which is now discussed.

The process further comprises an online stage, which integrates the segmenting method. The online stage may comprise providing the learnt neural network, e.g. by retrieving it from a memory where it has been stored at the offline stage. The online stage comprises the providing S30 of a 3D point cloud comprising an object according to the segmenting method. The online stage further comprises one or more iterations of the performing S40 of a selection operation of the object according to the segmenting method, and of the segmenting, by applying S50 the neural network, of the 3D point cloud, according to the segmenting method.

The learning method is now further discussed.

The learning method is for machine-learning for point cloud segmentation.

As known per se, a point cloud is an unordered set of points with coordinates (usually in 3D) that can be accompanied with additional characteristics (e.g. encapsulated in additional coordinates) such as intensity or color. The unordered aspect of this data makes it hard to analyze, especially compared to structured grids such as images. Different formats of point clouds exist, but the learnt neural network is agnostic to these different formats, as previously discussed.

Point cloud segmentation, also referred to as object segmentation, corresponds to the task of extracting all the points belonging to an object in a point cloud from the background points of the point cloud. As previously said, the neural network learnt by the learning method is able to deal with all type of objects, i.e. is agnostic to the object's category. Moreover, as previously said, the neural network allows to perform interactive segmentation. Interactive segmentation means a segmentation where a user indicates their interest about an object by interacting with the point cloud.

The learning method is a machine-learning method.

As known per se from the field of machine-learning, the processing of an input by a neural network includes applying operations to the input, the operations being defined by data including weight values. Learning a neural network thus includes determining values of the weights based on a dataset configured for such learning, such a dataset being possibly referred to as a learning dataset or a training dataset. For that, the dataset includes data pieces each forming a respective training sample. The training samples represent the diversity of the situations where the neural network is to be used after being learnt. Any dataset referred herein may comprise a number of training samples higher than 1000, 10000, 100000, or 1000000. In the context of the present disclosure, by "learning a neural network based on a dataset", it is meant that the dataset is a learning/training dataset of the neural network.

In the context of the learning method, the training dataset of the neural network is the provided dataset of 3D point clouds, which is now discussed.

The training dataset comprises 3D point clouds, each comprising at least one object and each equipped with a specification of one or more graphical user-interactions each representing a respective selection operation of a same object in the 3D point cloud. In other words, each 3D point cloud and the specification with which the 3D point cloud is equipped form a training sample of the training dataset. The specification may be referred to as "an interaction channel" or as a "user indicator", as it pertains to graphical user-interaction. The specification is further discussed hereinafter. Such a training sample may simply be referred to as "the 3D point cloud and its interaction channel", for the sake of simplicity. In any case, each training sample comprises a pair made of a 3D point cloud and its interaction channel. Each training sample may further comprise a segmentation mask which consists in, for each point of the 3D point cloud, an annotation of the point as belonging to said same object or as not belonging to said same object. This allows to learn S20 the neural network in a fully supervised manner, as further discussed hereinafter. The training dataset may in examples comprise about 2000 training samples.

As known per se, a 3D point cloud is made of a set of 3D points, e.g. each described by three cartesian coordinates in the 3D space. This amounts to say that each point cloud may be associated to a set of triplets each representing the 3D coordinates of a point of the 3D point cloud. Any 3D point cloud herein may represent a 3D real scene, a real scene being a piece of the real world (e.g. a plant scene or an office scene), each point of the 3D point cloud representing a point of the scene. "Representing a real scene" does not necessarily mean that the 3D point cloud stems from physical measurements performed in the real world. For example, any 3D point cloud herein may be a synthetic representation of a real scene, as further discussed hereinafter. Any 3D point cloud comprises at least one object. Each object of the 3D point cloud is herein a set of points of the 3D point cloud which each represent a point of a same object (e.g. of the real scene), the set of points forming altogether a representation of the object.

Any 3D point cloud herein may be a synthetic point cloud, i.e. a point cloud that stems from a synthetic point cloud generation process. In other words, a synthetic point cloud representing a real scene does not stem from physical measurements performed on a real scene to capture a representation of it, but forms a virtual, numerically generated, representation of a real scene. The synthetic point cloud generation process designates any computer-implemented process that outputs synthetic 3D point clouds. Such a process may output 3D point clouds each with a point-level annotation which specifies, for each point of an output 3D point cloud, whether the point belongs to an object or not (in the latter case the point may be said to belong to the background). Alternatively, such a process may output non-annotated 3D point clouds, each point cloud being annotated at a later stage. Alternatively, any 3D point cloud herein may be determined from physical measurements on a real scene. Determining the 3D point cloud may comprise providing one or more physical sensors (e.g. 3D scans, such as LIDARS) each configured for acquiring a respective physical signal and acquiring the one or more respective physical signals by operating the one or more physical sensors on the real scene (i.e. scanning the real scene with each sensor). The determining then automatically determines a 3D point cloud based on the measurements, according to any known technique. Note that, nowadays, state-of-the art sensors are able to provide clouds of millions of points giving very dense 3D scans of very high quality. In examples, the 3D point clouds of the training dataset or of at least a part of it may be synthetic 3D point clouds. In such a case, the providing S10 of the training dataset may comprise synthetically generating these 3D point clouds, by any known suitable synthetic point cloud generation process. The providing S10 may further comprise annotating each point cloud by annotating each point of the point cloud belonging to an object as "object" and each point belonging to the background as "background". Alternatively, the providing S10 of these 3D point clouds may comprise retrieving these 3D point clouds from a (e.g. distant) memory where they have been stored after their generation, e.g. and their annotation.

Figure 2:
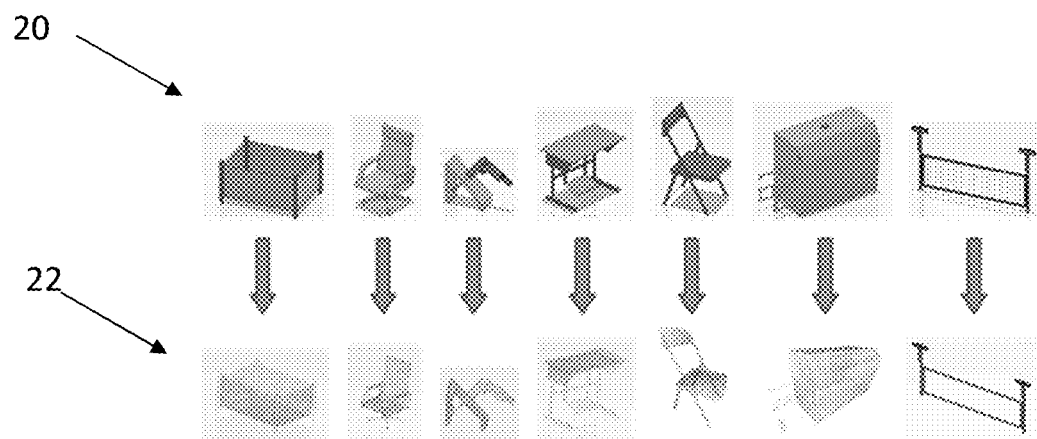
Figure 3:
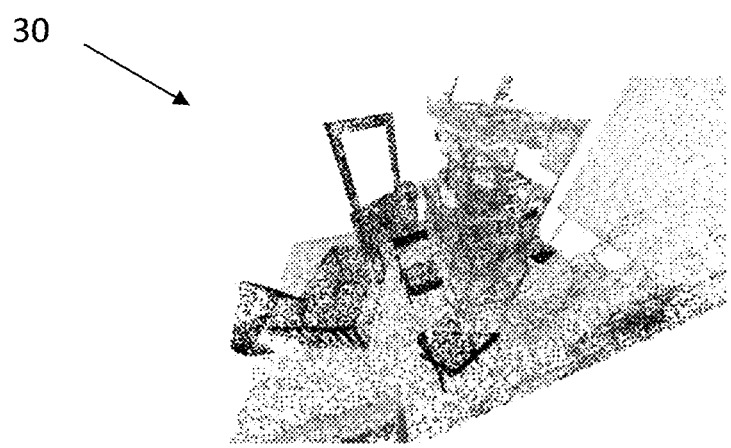

In examples of these examples, generating the 3D point clouds may comprise providing CAD (computer-aided-design) models of 3D objects. Generating the 3D point clouds may further comprise converting each provided CAD model of a 3D object into a 3D point cloud each representing the 3D object, the 3D point cloud being referred to as the "object point cloud" for simplicity. The generating may further comprise providing 3D point clouds each representing a background, and each referred to as "a background point cloud", for simplicity. The generating may further comprise inserting each object point cloud into a background point cloud. This results in the generated 3D point clouds, each formed by one or more object point clouds inserted into a background point cloud. The generating may additionally comprise annotating each point of each object point cloud as "object" and each point of each background point cloud as "background". FIGS. 2 and 3 illustrate these examples. FIG. 2 shows examples of CAD objects 20 which are converted in object point clouds 20. FIG. 3 shows an example 30 of object point clouds inserted in a background point cloud.

Note that while object insertion, the method may take into account possible occlusions (object/object occlusions or object/background occlusions) as well as point density normalization for realistic synthetic point cloud representation. Specifically, the method may consider these aspects for inserting point clouds obtained from CAD models in a scatter plot representing a background. They correspond to adaptation steps to reproduce the effects that can be observed in a real point cloud (from a 3D scanner). For example, if a point cloud corresponding to a CAD model of a table is inserted in a background, the method may adapt its density so that it corresponds to the density of the background in which it will be inserted. In the same way, occlusions may be considered by the method to approach a real point cloud. Taking the case of the table, for example, the method may delete the points belonging to the background that are located under the table's feet to keep only the points that could have been obtained by a real scanner. It is also to be noted that a 3D scanner only captures the points of visible surfaces during the acquisition. To circumvent this, the method allows in examples to add occlusions to a synthetically generated dataset.

In alternative examples of these examples, generating the 3D point clouds may comprise applying an automatic point cloud generation method that further provides automatic and accurate point-level annotation. The generation method may be any known generation method, such as the one described in Xiangyu Yue, Bichen Wu, Sanjit A. Seshia, Kurt Keutzer and Alberto L. Sangiovanni-Vincentelli "A LiDAR Point Cloud Generator: from a Virtual World to Autonomous Driving"—2018, which is incorporated herein by reference. This method proposes virtual scanner simulation to extract point clouds from 3D CAD scenes (e.g. video-game environments).

In yet other examples, the 3D point clouds of the training dataset or of at least a part of it may stem from physical measurements performed on real scenes, as previously discussed. In such a case, the providing S10 of the training dataset may comprise performing the physical measurements and determining the 3D point clouds based on the physical measurements, as previously discussed. The providing S10 may further comprise annotating each point cloud by annotating each point of the point cloud belonging to an object as "object" and each point belonging to the background as "background". Alternatively, the providing S10 of these 3D point clouds may comprise retrieving these 3D point clouds from a (e.g. distant) memory where they have been stored after their generation, e.g. and their annotation. For example, the 3D point clouds of the training dataset may be retrieved from a public point cloud dataset (such as the datasets provided in Timo Hackel and N. Savinov and L. Ladicky and Jan D. Wegner and K. Schindler and M. Pollefeys. "SEMANTIC3D.NET: A new large-scale point cloud classification benchmark".—ISPRS 2017, in Andreas Geiger and Philip Lenz and Raquel Urtasun. "Are we ready for Autonomous Driving? The KITTI Vision Benchmark Suite"— CVPR 2012, and in Iro Armeni and Ozan Sener and Amir R. Zamir and Helen Jiang and Ioannis Brilakis and Martin Fischer and Silvio Savarese. "3D Semantic Parsing of Large-Scale Indoor Spaces"—CVPR 2016, which are all incorporated herein by reference). The providing S10 may comprise a binary annotation "object vs background" of the point clouds retrieved from such a public dataset.

In any case, the providing S10 of the training dataset of 3D point clouds may comprise providing the 3D point clouds. Each 3D point cloud is equipped with its specification, as previously said. The specification forms data about one or more graphical user-interactions which each represent a respective selection operation of a same object in the point cloud. This amount to say that the specification describes how said same object is selected by the one or more graphical user-interactions, e.g. based on data about the relative positioning of the object and the one or more graphical user-interactions. This allows to learn the neural network so that it can segment a 3D point cloud based only on the detection an object selection by graphical user-interaction. The providing S10 of the training dataset may comprise determining the specification, for each point cloud, and equipping the point cloud with it. Determining the specification may comprise computing/simulating the specification, i.e. for each 3D point cloud of the dataset. Alternatively, determining the specification may comprise providing the specification by hand, e.g. manually by a user performing the one or more graphical user-interactions, i.e. for each 3D point cloud of the dataset.

As previously said, the specification may be referred to as an "interaction channel" or a "user indicator". Specifically, each point of the 3D point cloud may be represented by a set of three cartesian coordinates in the 3D space. The point may further comprise a fourth coordinate representing how the point is affected by the one or more graphical user-interactions. In other words, the fourth coordinate forms data encapsulating a degree of affectation of the point by the selection of said same object through graphical user-interaction. The data may for example represent a closeness of the point to at least one of the one or more graphical user-interaction.

Examples of the providing S10 of the training dataset are now discussed.

In examples, the providing S10 of the training dataset of 3D point clouds comprises providing the 3D point clouds. The providing S10 of the training dataset further comprises for each 3D point cloud, providing information about location of said same object in the 3D point cloud. The providing S10 of the training dataset further comprises for each 3D point cloud: determining the specification by simulating each graphical user-interaction of the one or more graphical user-interactions and equipping the 3D point cloud with the specification of the one or more graphical user-interactions.

The information about location of said same object may consist in any information that allows to distinguish said same object from other parts of the 3D point cloud (e.g. other objects, if any, or the background). In examples, the information comprises, for each point of the object, an annotation of the point as "object". The information may also comprise the coordinates of the point. Providing the information may comprise annotating each point of said same object as "object", e.g. as previously discussed. Providing the information may further comprise annotating each point of the background as "background", e.g. as previously discussed. Providing the information may comprise annotating each point of each other object, if any, as "other object". This can be used by the method, for example, to add negative seeds to neighboring objects of a target object, as further discussed hereinafter. However, it is not mandatory. Indeed, adding seeds in a region around an object of interest suffice so that these will also be found on neighboring objects (if there are neighboring objects).

Simulating each graphical user-interaction yields data about the location of the graphical user-interaction. It is to be understood that "simulating" means that the graphical user-interaction is virtual, i.e. numerically created. In other words, the learning method equips the 3D point clouds with the specification of an object selection by a simulated user behavior. In yet other words, said data about the location is numerically created, e.g. relatively randomly and/or according to a predefined program/strategy. Determining the specification is based on these data and on the information about location of said same object. For example, the determining of the specification may take into account these data and this information to yield the specification. Simulating each graphical user-interaction of the one or more graphical user-interactions allows to obtain the specification without manual work of a user, which would be time consuming and/or prone to an overfitting. Moreover, this makes the graphical user-interaction virtual, which for example allows them to be relatively random and/or well-diversified, thereby yielding a well-diversified training dataset. This improves the quality of the learning, as known per se from the field of machine-learning.

In examples, each graphical user-interaction of the one or more graphical user-interactions correspond to one or more seed locations each defined over the 3D point cloud. In these examples, the simulating of the graphical user-interaction comprises determining the one or more seed locations.

Each seed location is data representing the location of at least a part of the graphical user-interaction. The one or more seed locations form altogether data representing the location of the graphical user-interaction over the 3D point cloud. Each seed location may for example consist in a set of three cartesian coordinates in the 3D space, indicating the position of a point of the graphical user-interaction. In other words, the seed location may consist in a point in the 3D space, which may or may not coincide with a point of the 3D point cloud. For example, a seed location may be the point of the 3D point cloud which is the closest to the location, represented by the seed, of the at least a part of the graphical user-interactions. This allows the graphical user-interaction, which is simulated, to be a virtual representation of many types of different and usual graphical user-interactions for object selection. Indeed, many types of well-known and usual graphical user-interactions can be represented by a set of one or more seed locations. For example, the one or more seed locations may represent one or more clicks of a user over the 3D point cloud, each seed location representing (e.g. being) a point in the 3D space that corresponds to the location of one of the clicks. The seed location may for example be the point of the 3D point cloud which is the closest to the location of the click. Alternatively, the one or more seed locations may represent a stroke of the user over the 3D point cloud, each seed location representing (e.g. being) a point in the 3D space that corresponds to a sampled position of the line of the stroke. Alternatively, the one or more seed locations may represent a bounding box drawn/defined by the user over the 3D point cloud, each seed location representing (e.g. being) a point in the 3D space that corresponds to a sample position of the inside or the outside of the bounding box. As all of this holds for each graphical user-interaction, this means that the one or more graphical user-interactions may be virtual representations of one or more of: one or more clicks over the 3D point cloud, a stroke over the 3D point cloud, and/or a bounding box drawn/defined over the 3D point cloud. Each seed location may be simply referred to as a "seed" in the following, for conciseness.

Determining the one or more seeds may comprise computing the one or more seeds, e.g. relatively randomly and/or according to a predefined strategy, e.g. for ensuring a certain number of seeds and/or a reasonable distance between them. Where the one or more seeds are one or more points in the 3D space, determining the one or more seeds may comprise determining the coordinates of the one or more points.

In examples, the one or more graphical user-interactions comprise a first graphical user-interaction for selecting said same object. The first graphical user-interaction corresponds to one or more first seed locations each defined over said same object.

The first graphical user-interaction may be referred to as a "positive interaction", as it pertains to the selection of said same object. Said otherwise, the positive interaction represents a graphical user-selection of said same object by actually selecting it, e.g. not by discarding other parts of the 3D point cloud. Providing the training dataset with data about positive interactions allows to learn the neural network so that it will detect such interactions for performing the segmentation. Examples of such positive interactions, e.g. that the first graphical user-interaction may represent, are: performing one or more clicks on said same object, performing a stroke on said same object, or drawing/defining a bounding box over said same object and/or around it.

As the first graphical user-interaction is a positive user-interaction, it is a virtual representation of a graphical user-interaction performed on said same object that is over points of said same object. Thereby the one or more first seed locations are each defined over said same object. For example, where the one or more first seed locations are one or more points, the one or more points are located substantially among points of said same object. The simulating of the first graphical user-interaction comprises determining the one or more first seeds. Determining the one or more first seeds may be carried out randomly, e.g. by randomly selecting one or more points of said same object as the one or more first seeds, or partially randomly. This provides simplicity for forming the training dataset.

In examples, the determining of the one or more seed locations comprises spreading the one or more first seed locations over said same object. Spreading the one or more first seeds may comprise determining each seed by selecting as the seed a point of the point cloud, e.g. randomly, among a restricted set of points of the point cloud. Spreading the one or more first seeds may comprise determining the number of first seeds and selecting this number of first seeds with a predefined distance between them. The number and/or the predefined distance may for example depend on the object size. This allows the first seeds to cover well said same object.

An implementation of the spreading is now discussed.

This implementation allows simulation of user behaviors for the positive interactions. In comparison to a total random approach, the simulated first graphical user-interaction here correspond to a user-likely positive interaction where the user-interaction results in a certain number of seeds with respect to the size of said same object and with a reasonable distance between. This allows to cover well the object. For example, when selecting an object by performing clicks on it, a user typically covers the object with clicks. When selecting an object by performing a stroke on it, a user typically draws a stroke that covers the object. When selecting an object with a bounding box, a user may typically draw the bounding box in such a way that the inside of the bounding box covers the object, for example by framing the object within the bounding box. This implementation comprises determining the number of the one or more first seeds according to a normal probability distribution of the type:

$$X \sim N(\mu, \sigma) \quad (1),$$

with X the number of first seeds, µ corresponding to (i.e. equal to) M*p/K, with M the number of points of said same object, p a proportion of the object to be affected by the first graphical interaction (e.g. 20%) and K being a number of neighbors. The number K is further discussed hereinafter. σ may equal 1. This allows a flexibility regarding the number of first seeds while keeping a coherence relatively to the size of the considered graphical-interactions. This implementation may further comprise fixing a minimal distance between seeds, thereby allowing for a better coverage of said same object. The fixing may comprise iteratively selecting first seeds, and at each iteration, exclude from the selection all the points contained in a bounding box region around the previously selected first seed. The size of this bounding box can be fixed in relation to the size of the object (e.g. a proportion of the length, width, height of the object). The number X of first seeds may be chosen according to formula (1) but may be rounded to the closest integer part larger than 1 or equal to 1.

A particular implementation of the currently-discussed implementation of the spreading is now discussed. In the particular implementation, said object is referred to as "the object of interest", and each seed is referred to as "a positive seed". The particular implementation is carried out according to an algorithm, which has the following specifications:

The input variable is:
  objPoints: variable that contains all the points of the object of interest, K: variable that is the number of neighbors considered for this point cloud. The number K is further discussed hereinafter, proportion: parameter that controls the proportion of the object to be affected by the first graphical interaction, standardDeviation: parameter that controls the variance of the distribution that is used to state about a number of positive seeds.

The output variable is:

seeds: variable that contains a list of all the positive clicks (coordinates) for the object of interest.

The intermediate variables that appear are:

numberOfObjPoints: variable that corresponds to the number of points that belong to the object of interest, numberOfSeeds: variable that corresponds to the number of positive clicks that will be performed for this object of interest, seed: variable that corresponds to the coordinates of one positive click.

The functions that appear without being explicitly declared are:

RandPoint( ): function that returns a random point in a set of points,

RegionAround( ): function that returns a region around point coordinates. Here it is used to suppress all the points of the object in a region around a previous click, assuring a minimal distance between clicks, NormalDistribution(mean, standardDeviation): function that returns a float value according to a normal distribution that is defined by its input parameters.

The algorithm is described by the following pseudo-code:

---

Algorithm 1 Example: Positive Seeds Selection

---

```
procedure POSITIVESEEDS(obj Points, K. proportion = 0.2, standardDeviation = 1) :
    numberOfObjPoints ← len(objPoints)
    numberOfSeeds ← NormalDistribution(numberOfObjPoints * proportion/K, standardDeviation)
    numberOfSeeds ← MAX(1,INTEGER(numberOfSeeds))
    seeds = [ ]
    for i in range (numberOfSeeds) do
        seed ← RandPoint(objPoints)
        objPoints ← obj Points – RegionAround(seed)
        seeds.append(seed)
    end for
    return seeds
end procedure
```

---

In examples where the one or more graphical user-interactions comprise the first graphical user-interaction, for at least one 3D point cloud (i.e. of the training dataset), the one of more graphical user-interactions further comprise a second graphical user-interaction for discarding a region outside of said same object and corresponding to one or more second seed locations each defined outside said same object.

The second graphical user-interaction may be referred to as a "negative interaction", as it pertains to the selection of said same object through the discarding of a region outside of the object. Said otherwise, the negative interaction represents a graphical user-selection of said same object by discarding a part of the point cloud that is not said same object. Providing the training dataset with data about negative interactions, in addition of positive interactions, allows learning of the neural network so that it will detect both positive and negative interactions for performing the segmentation. This improves the ability of the neural network to perform segmentation, as user graphical-selections of an object in a point cloud may often involve a mix of positive interactions (e.g. for performing a rough selection of an object) and negative interactions (e.g. for then refining the selection by discarding outside regions, such as the background or another object). Examples of such negative interactions, e.g. that the second graphical user-interaction may represent, are: performing one or more clicks outside said same object (e.g. on the background or on another object) or performing a stroke outside said same object (e.g. on the background or on another object). Moreover, the ability of the learning method to mix positive and negative interactions allows to learn the neural network in such a way that the neural network is able to detect an object graphical selection consisting in a user drawing/defining a bounding box around the object: the points outside the bounding box (or at least a sample of them) are detected by the neural network as second seeds, and the points inside (or at least a sample of them) as first seeds.

The mix of positive and negative seeds allows each graphical user-interaction to represent typical graphical interactions such as clicks, strokes and bounding boxes, all these graphical interactions having the property of being represented by seeds as previously discussed. Specifically, clicks represent the minimal interaction available since a click directly corresponds to a seed. A stroke can be sampled into a collection of seeds (e.g. a collection of individual points) by sampling seeds' positions from the line of the stroke, making it very close in the needed generation as the one for clicks. Bounding boxes can also be traduced into a collection of seeds by sampling individual point indicators inside and outside the box for positive and negative clicks respectively, supposing that the bounding box is used to roughly indicate the object of interest. In examples, the learning method may however deviate from these paradigms in order to determine seeds that optimally correspond to a specific type of user-interactions, i.e. for applications where the input graphical user-interaction is always of the same type, e.g. a bounding box. For instance, the learning method may perform an optimization to produce seeds from bounding boxes by sampling seeds from inside and outside training boxes that have varying heights, lengths and widths for each interaction on said same object. Moreover, some training bounding boxes could partially include said same object. In this manner, the neural network can identify an object in the point cloud even where users provide bounding boxes that only partially enclose the object.

As the second graphical user-interaction is a negative user-interaction, it is a virtual representation of a graphical user-interaction performed outside of said same object that is over points outside of said same object. Thereby the one or more second seed locations are each defined outside of said same object. For example, where the one or more second seed locations are one or more points, the one or more points are located substantially among points outside of said same object. The simulating of the second graphical user-interaction comprises determining the one or more second seeds. Determining the one or more second seeds may be carried out randomly, e.g. by randomly select one or more points outside of said same object as the one or more second seeds (i.e. one or more points of the background or of another object), or partially randomly.

An implementation of the determining of the one or more second seeds is now discussed.

In this implementation, the determining of the one or more second seeds may be carried out according to different strategies. Each strategy allows to simulate a typical user behavior and to match a real-world interaction type.

According to a first strategy, the determining of the one or more second seeds determines the one or more second seeds around (e.g. within a predefined distance of) said same object. This strategy simulates the most likely way for a user to specify the object boundaries. The determining of the one or more second seeds according to this strategy may comprise extracting a close region of the background points around the object of interest (e.g. a region inferior to 30 centimeters, i.e. a strip around the object and having a width of 30 centimeters) and selecting, as the one or more second seeds, one or more random points in the region.

According to a second strategy, the determining of the one or more second seeds around (e.g. within a predefined distance of) said same object determines the one or more second seeds on neighboring objects of said same object (e.g. objects within a predefined distance of said same object). This strategy simulates a classification of objects as background objects, also matching a real-world user behavior. The determining of the one or more second seeds according to the second strategy requires annotations for all objects in the point cloud scene. The determining of the one or more second seeds according to this strategy may comprise selecting randomly a point on each background object among the ones that are the closest to said same object, the selected point(s) being the one or more second seeds.

According to a third strategy, the determining of the one or more second seeds determines the one or more second seeds randomly (e.g. even far away from the object of interest) to suppress random false first seeds and match other user behaviors. The determining according to this strategy may comprise randomly picking, as the one or more second seeds, one or more background points (i.e. all the points of the 3D point cloud minus the points of said same object).

It is to be understood that, although for each 3D point cloud in the training dataset there is at least one positive interaction (i.e. the first graphical user-interaction) within the one or more graphical user interactions, there may not necessarily be a negative interaction (i.e. the second graphical user-interaction). In examples, there is one or more 3D point clouds in the dataset for which the one or more graphical user-interactions comprise the second graphical user-interaction which has been previously discussed. The learning method may determine the one or more second seeds respective to each one of these second graphical user-interactions each with a given strategy, for example chosen relatively randomly among the first, second, and third strategies previously discussed. By "relatively randomly", it is meant here that some strategies may have a greater probability than other to be chosen. For example, the first strategy may have the largest probability to be chosen as it simulates a user behavior that is likely to happen in the real world. The second strategy may be optional, i.e. in examples of the learning method it is never chosen, for example, when background objects are not annotated as such.

As for the first graphical user-interaction, the number of determined second seeds, irrespective of the strategy, may be drawn from a probability distribution centered on a targeted number of second seeds. This targeted number of second seeds may typically be a parameter that controls the amount of interactions simulated but also the easiness of the task that the neural network learns (i.e. segmentation). For example, a target number of 0 aims that positive interactions only provide enough information to extract an object but may cause an instability to negative clicks and limit the quality of the extraction. In the other hand a high target number (e.g. 15) should assure a precise segmentation mask but will require many user interactions during the use of the neural network. A corresponding implementation comprises determining the number of the one or more second seeds according to a normal probability distribution of the type:

$$X \sim N(\mu, \sigma) \quad (1),$$

with X the number of second seeds. An example set of parameters for the normal probability distribution is $\mu=1$ and $\sigma=1$. The number of second seeds X may have 0 as lower bound when X is determined.

A particular implementation of the currently-discussed implementation of the determining of the one or more second seeds is now discussed. In the particular implementation, said object is referred to as "the object of interest", and each seed is referred to as "a negative seed". The particular implementation is carried out according to an algorithm, which has the following specifications:

The input variables are:
objPoints: variable that contains all the points of the object of interest,
scenePoints: variable that contains all the points of the scene (including the object of interest),
mean: parameter that controls the mean of the distribution that is used to state about a number of negative seeds,
standardDeviation: parameter that controls the variance of the distribution that is used to state about a number of negative seeds,
pStrategy: parameter that controls the probability to choose one strategy over the others.

The output variable is:
seeds: variable that contains a list of all the negative clicks (coordinates) for the object of interest.

The intermediate variables that appear are:
backgroundPoints: variable that contains all the points from the point cloud scene minus the point belonging to the object of interest.
strategy: variable that corresponds to the chosen strategy. It can be:
  random (random points from the background points),
  neighboringObjs (clicks on the closest objects from the object of interest),
  surroundings (clicks in a small region around the object of interest).
numberOfSeeds: variable that corresponds to the number of negative clicks that will be performed for this object of interest,
seed: variable that corresponds to the coordinates of one negative click,
nearestObjs: variable that is a list of all neighboring objects' point cloud. Length is numberOfSeeds.

The functions that appear without being explicitly declared are:
RandPoint( ): function that returns a random point in a set of points,
RegionAround( ): function that returns a region around point coordinates. In our case this is used to suppress all the points of the background in a region around a previous click, assuring a minimal distance between clicks,
NearestObjs( ): function that returns a list of all neighboring objects' point cloud. Length is numberOfSeeds,
SmallerRegionAroundObj( ): function that returns a close region of background points around the object of interest,
NormalDistribution(mean, standardDeviation): function that returns a float value according to a normal distribution that is defined by its input parameters.

The algorithm is described by the following pseudo-code:

In examples, the equipping of the 3D point cloud comprises, based on the simulating of each graphical user-interaction, adding to each point of the 3D point cloud a coordinate. The coordinate quantifies an intensity of the selection operation at the point.

"Based on the simulating of each graphical user-interaction" means that the equipping of the 3D point cloud takes into account said data about the location of each simulated graphical user-interaction. In fact, equipping the 3D point cloud comprises here processing these data and converting them into a set of coordinates, one coordinate per each point of the 3D point cloud. Equipping the 3D point cloud comprises then adding this coordinate to each point, and this results in the specification. Said otherwise, the specification is the set of all the coordinates added to each point of the 3D point cloud.

The converting is such that for each point, the coordinate quantifies an intensity of the selection operation at the point.

Algorithm 2 Example: Negative Seeds Selection

```
procedure NEGATIVESEEDS(scenePoints, objPoints, mean = 1, standardDeviation = 1,pStrategy =
[0.1, 0.35, 0.55]) :) :
        seeds = [ ]
        backgroundPoints ← scenePoints − objPoints
        strategy ← RAND(random;neighboringObjs;surroundings,pStrategy)
        numberOfSeeds ← Normal Distribution (mean,standardDeviation)
        numberOfSeeds ← MAX(0,INTEGER(numberOfSeeds)
        if strategy = random then
            for i in range(numberOfSeeds) do
                    seed ← RandPoint(backgroundPoints)
                    backgroundPoints ← backgroundPoints − RegionAround(seed)
                    seeds.append(seed)
            end for
    else if strategy = neighboringObjs then
            nearestObjs ← NearestObjs(backgroundPoints,objPoints,numberOfSeeds)
            for i in range(numberOfClicks) do
                    seed i ← RandPoint(nearestObjs[i])
                    seeds.append(seed)
            end for
    else if strategy = surroundings then
            backgroundPoints ← SmallerRegionAroundObj(backgroundPoints, objPoints)
            seeds ← RandPoints(backgroundPoints,numberOfSeeds)
        end if
        return seeds
        end procedure
```

In any case, after the simulating, data about the location of each graphical user-interaction has been determined by the simulation of the graphical user-interaction. In examples, at this point, for each 3D point cloud, and for each of the one or more graphical user interaction for the 3D points cloud, the simulating of the graphical user-interaction results in that:
if the graphical user-interaction is a positive interaction (at least one of the one or more graphical user-interactions is), one or more first seeds have been determined as explained above, and
if the graphical user-interaction is a negative interaction, one or more second seeds have been determined as explained above.

Determining the specification may then comprise processing the data about the location of all the simulated graphical user-interactions and converting them into one piece of data forming the specification. Equipping the 3D point cloud with the specification may then comprise associating the specification with the 3D point cloud to form a pair, said pair forming a training sample.

Examples of the equipping are now discussed for the learning method.

Specifically, the coordinate quantifies a closeness of the point to each graphical user-interaction. This quantifies whether the point belongs to the object to select (i.e. said same object) or not. This eventually allows, during the learning S20, the neural network to learn to select, or not, a point as being part of an object, when the neural network performs the segmentation. For example, the neural network is train to detect that, the higher the coordinate is, the greater is the probability of the point to belong to the object to select.

In examples, each graphical user interaction of the one or more graphical user-interactions is for selecting said same object (e.g. is a first graphical user-interaction as previously discussed) or for discarding a region outside of said same object (e.g. is a second graphical user-interaction as previously discussed). In these examples, for each point of the 3D point cloud, the adding of the coordinate comprises:
setting the coordinate to an initial value;
for each graphical user-interaction for selecting said same object, increasing the coordinate according to a closeness between the graphical user-interaction and the point; and for each graphical user-interaction for discarding a region outside of said same object, decreasing the coordinate according to a closeness between the graphical user-interaction and the point.

Increasing the coordinate according to a closeness between the graphical user-interaction and the point may comprise quantifying a distance between the location of the point and a location of the graphical user-interaction. For example, the graphical user-interaction may be a previously-discussed first graphical user-interaction defined by one or more first seeds. Quantifying the distance may comprise quantifying each distance between the point and a respective first seed. Increasing the coordinate may then comprise adding to the coordinate a value representative of each quantified distance.

Decreasing the coordinate according to a closeness between the graphical user-interaction and the point may comprise quantifying a distance between the location of the point and a location of the graphical user-interaction. For example, the graphical user-interaction may be a previously-discussed second graphical user-interaction defined by one or more second seeds. Quantifying the distance may comprise quantifying each distance between the point and a respective second seed. Increasing the coordinate may then comprise adding to the coordinate a value representative of each quantified distance.

It is to be understood that, for any point of the 3D point cloud, if the point is too far from a graphical user interaction, be it a graphical user-interaction for selecting said same object or for discarding a region outside of it, the coordinate of the point is neither increased nor decreased. In other words, for each point and each graphical user-interaction of the one or more graphical user-interactions, the increasing or decreasing of the coordinate only occur when the point is relatively close to the graphical user-interaction (e.g. within a certain range of distance from a seed defining the graphical user-interaction). It may thus happen that a point has its coordinate still equal to the initial value after the equipping.

Adding the coordinates in such a manner has the following effect: the more a point is close to one or more graphical user-interactions that are for selecting said same object, the more the point is likely to belong to said same object, and the more its added coordinate has a high value. Conversely, the more a point is close to one or more graphical user-interactions that are for discarding a region outside of said same object, the more the point is likely to belong to said region, and the more its added coordinate has a low value. Eventually, this helps to learn the neural network in such a way that it will detect when a graphical user-interaction is for selecting an object, and when it is for discarding a region outside the object.

An implementation of the equipping of the 3D point cloud with the specification is now discussed for the learning method.

In this implementation, for each 3D point cloud, the one or more graphical user-interactions comprises one or more previously-discussed first graphical user-interaction, and for each of them the determining of the one or more seed locations comprises the spreading of the one or more first seeds according to the implementation of the spreading previously discussed. In the currently-discussed implementation, the one or more graphical user interactions may comprise one or more previously-discussed second graphical user-interaction, and if this is the case, for each of them, the determining of the one or more second seeds is performed according to the previously-discussed implementation of the determining of the one or more second seeds.

Thus, in the currently-discussed implementation, the simulating of the one or more graphical user-interactions results in:
for each first graphical user-interaction (i.e. each positive interaction), the location of the one or more first seeds,
for each second graphical user-interaction (i.e. each negative interaction), the location of the one or more second seeds.

Furthermore, in this implementation, each seed is a point, as previously discussed. This implementation comprises converting the seeds into the specification, which is now referred to as the interaction channel. The converting uses a K-nearest neighbors search to retrieve the K closest points to each seed and assign them a particular intensity based on their distance from each seed.

Specifically, the adding of the coordinate comprises, for all points of the 3D point cloud, initializing the coordinate with the same value, said same value being equal to 128. The adding of the coordinate then comprises, for each seed, retrieving the K closest points to the seed, for example according to a nearest neighbor search algorithm. Here the number K is the number K previously discussed in relation with formula (1). The retrieving may comprise modulating the number of neighbors used in the K nearest neighbor search according to the number of points of the 3D point cloud. This allows the search to be invariant to the point cloud density. The modulating may be carried out according to the following formula:

$$K = m \times \left\lceil \frac{N \times k}{D \times m} \right\rceil, \quad (2)$$

where D is a default number of points considered, m a degree of modularity chosen and k a default number of neighbors considered.

Experiments have shown that this formula for K proved itself very stable for various point cloud sizes (a range of around 10 k to 500 k points was tested with D=100000, k=1024 and m=128 for a region of 3*3*5 meters). These numbers were chosen in the experiments to correspond to a graphical interaction size that globally corresponds to the size of the smallest objects while being big enough to reduce the number of interactions for the large objects. Then, for clarity, it was chosen with respect to the observed number of object points per object in the training dataset and the density of the point clouds. This allowed in the experiments to find a way to determine an optimal K that will suit all objects and point cloud densities.

The adding of the coordinate comprises then, for each seed and each point of the 3D point cloud that belongs to the K neighbors of the seed, modifying the coordinate by:
adding to the coordinate a Gaussian intensity from the seed if the seed is a first seed, or
subtracting from the coordinate a Gaussian intensity from the seed if the seed is a second seed.

The modifying may in fact comprise, for each seed, computing the Gaussian intensity and dynamically modulating it based on the median distance of the K distances of the K closest points to the seed. The computing of the Gaussian intensity for a first seed, also referred to as positive seed, may be carried out according to the formula:

$$\text{interactionIntensity}(\text{distFromPositiveSeed},s) = 127 * e^{-0.5*((\text{distFromPositiveSeed}/s)^2)},$$

where s=median(arrayOfNeighborsDistances), $s \in \mathbb{R}$, where arrayOfNeighborsDistances$\in \mathbb{R}^2$ contains the distances from the positive seed for each neighbor and has a size of (K,1), and where K is the number of nearest neighbors.

The computing of the Gaussian intensity for a second seed, also referred to as negative seed, may be carried out according to the formula:

$$\text{interactionIntensity}(\text{distFromNegativeSeed},s) = 127e^{-0.5*((\text{distFromNegativeSeed}/s)^2)},$$

where s=median(arrayOfNeighborsDistances), $s \in \mathbb{R}$, where arrayOfNeighborsDistances $\in \mathbb{R}^2$ contains the distances from the negative seed for each neighbor and has a size of (K,1), and where K is the number of nearest neighbors.

It is to be noted that the added coordinate is initialized at 128 for all points. The multiplication of the Gaussian intensity by 127 allows to have a maximum value of 255 for the points matching positive seeds. For those matching negative seeds, the corresponding final point intensity is 1. Therefore the intensity covers the same amplitude as the color channels and allows further simple normalization step (normalization between 0-1 for each channel by dividing by 255), should the point clouds be equipped each with a color channel. The dynamic s parameter as the median value of the array of the neighbors' distances offers some flexibility to work with different point cloud densities. Contributions from all the points matching a seed are added and the equipping comprises clipping the coordinate, belonging to [0, 255], and concatenating it to the other coordinates of the point, and this for each point. The interaction channel/specification is the set of all the concatenated coordinates. For example, for a 3D point cloud of N points with the coordinates xyz as the only features, the equipping results in a (N, 3+1) final point cloud dimension. If the colors are present, the equipping results in a (N, 6+1) dimension, etc. In conducted experiments, taking only point coordinates, i.e. and not colors, showed great results.

As a result, in this implementation, the training dataset is made of training samples each composed of pairs of point clouds and their interaction channels. Each training sample may also further comprise a segmentation mask, which indicates, for each point of the 3D point cloud, whether the point belongs to said same object or not, as known per se from the field of point cloud segmentation. The segmentation mask may be created at the step of annotation of the 3D point clouds, which as been previously discussed.

Figure 4:
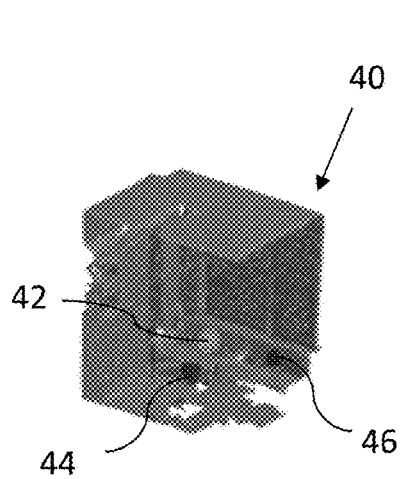
Figure 5:
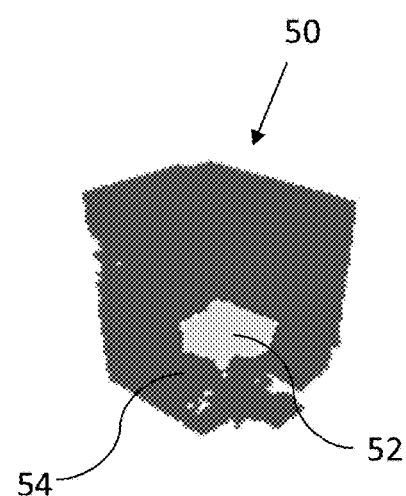

FIG. 4 shows a point cloud 40 and its interaction channel. FIG. 4 notably shows a positive seed 42 and two negative seeds 44 and 46. FIG. 5 shows the corresponding segmentation mask 50, indicating the part of the point cloud 40 corresponding to said same object 52, and the part that does not correspond to said same object 54.

The learning S20 of the neural network is now discussed.

As previously explained, the neural network has weights forming data which define the operations that the neural network applies to an input for processing it. Learning S20 the neural network comprises determining values of the weights based on the training dataset. Learning S20 of the neural network may be performed according to any known technique. In the examples, the learning S20 of the neural network is performed according to any known Deep Neural Network (DNN) learning method.

As known per se from the field of machine-learning, DNNs are a powerful set of techniques for learning in Neural Networks, which is a biologically-inspired programming paradigm enabling a computer to learn from observational data. See for example: E. Rumelhart, G. E. Hinton, R. J. Williams, Learning internal representations by error propagation, Parallel distributed processing: explorations in the microstructure of cognition, vol. 1: foundations, MIT Press, Cambridge, M A, 1986, which is incorporated herein by reference. In object recognition, the success of DNNs is attributed to their ability to learn rich midlevel media representations as opposed to hand-designed low-level features (Zernike moments, HOG, Bag-of-Words, SIFT, etc.) used in other methods (min-cut, SVM, Boosting, Random Forest, etc.). More specifically, DNNs are focused on end-to-end learning based on raw data. In other words, they move away from feature engineering to a maximal extent possible, by accomplishing an end-to-end optimization starting with raw features and ending in labels.

The neural network herein may be any known deep learning model that can perform point cloud segmentation. For example, the neural network may be the PointCNN (see [4] Li, Yangyan, Rui Bu, Mingchao Sun, Wei Wu, Xinhan Di, and Baoquan Chen. "PointCNN: Convolution On X-Transformed Points."—NeurIPS 2018, which is incorporated herein by reference). The neural network may comprise millions of parameters which values cannot be set by hand. The learning S20 comprises setting/updating the values of these parameters. When the learning algorithm is updating the model parameters, the model is said to be in "training mode". It consists in successively "correcting" the model according to its output for each input thanks to the annotations associated with each input. An annotation is a set of data associated with a specific input which allows evaluating if the output of the model is true or false. Supervising the training of a model thanks to an annotated dataset is called "supervised learning". Once the model is trained, the updating of the parameters stops. Then, the model is only used to process a new input (i.e. an unseen input during the training mode) and return results, it is said to be in "test mode". The learning S20 of the neural network may integrate all these deep learning concepts, which are well known from the field of machine-learning.

The neural network is configured to segment an input 3D point cloud comprising an object, based on the input 3D point cloud and on a specification of one or more input graphical user-interactions each representing a respective selection operation. In other words, the neural network takes as input an input 3D point cloud equipped with the specification. In yet other words, the neural network takes as input a piece of data that is of the same type than any sample of the training dataset. The neural network is configured for segmenting the input 3D point cloud. In other words, based on its input, the neural network performs extraction of the object comprised in the input 3D point cloud. The neural network is able to do so because the input 3D point cloud is equipped with the specification and the neural network is learnt S20 to detect such a specification. In other words, the specification indicates locations of one or more input graphical user-interactions for selecting the object, and the neural network detects from this specification that the object is to be selected. As previously said, it is to be noted that the neural network is agnostic to the point cloud category and to the object category. The neural network outputs data indicating a distinction between the object and the rest of the background, for example a segmentation mask.

For example, the neural network may output a classification result for each point of the input point cloud with a corresponding confidence score. Specifically, in such example, for each point, the neural network outputs a classification of the point as part of the object or not, together with a confidence score. The confidence score is a real between 0 and 1. The closer it is to 1, the more confident the neural network is for the label associated to the point. Said otherwise, the neural network outputs a segmentation mask for the object. In these examples, each training sample comprises a segmentation mask as well, classifying each point of a point cloud as "object" or "background", as previously discussed. The learning S20 is in these examples a fully supervised one.

The segmenting method is discussed as of now.

The segmenting method is a method for interactive point cloud segmentation.

As such, the segmenting method comprises providing S30 a 3D point cloud comprising an object. As any 3D point cloud of the training dataset, the 3D point cloud here may represent a real scene, and it may stem from physical measurement or from a synthetic point cloud generation process. Providing S30 may comprise displaying the 3D point cloud on a display (e.g. a graphical user interface) of a computer system performing the segmenting method. The 3D point cloud may be displayed to a user, thereby allowing the user to graphically interact with the 3D point cloud, e.g. for indicating its interest for the object.

The segmenting method also comprises one or more iterations that correspond to the interactive segmentation of the provided 3D point cloud. Specifically, each iteration comprises performing S40 a selection operation of the object by performing one or more graphical user-interactions. In other words, the user graphically interacts one or more times with the (e.g. displayed) provided 3D point cloud to indicate its interest for the object. Each graphical user-interaction pertains to the selection of the object, the one or more graphical user-interactions forming altogether a selection operation of the object.

By "graphical user-interaction" with respect to the selection of the object, it is hereby meant any user-interaction where the user employs a haptic system (e.g. a mouse or a touch device such as a sensitive/touch screen or a sensitive/touch pad) to indicate its interest about the object, e.g. by selection of one or more locations of the display unit. The one or more locations may form distinct locations, such as one or more clicks. Alternatively, they may altogether form a contiguous shape, such as a stroke or a bounding box. The one or more locations may be over the object, in which case the graphical user-interaction is for selecting the object. The one or more locations may alternatively be over a region outside the object (e.g. another object or the background), in which case the graphical user-interaction is for discarding said region. Substantially in real-time after the activation, a visual indication of the selection may be displayed.

In examples, the one or more graphical user-interactions may comprise a graphical user-interaction consisting in performing one or more clicks over the object. The performing of the one or more clicks may be performed with a haptic device, e.g. the user clicks or touches one or more times the displayed 3D point cloud at one or more locations over the object. This graphical user-interaction is for selecting the object, as it pertains to the selection of one or more locations (i.e. those of the one or more clicks) over the object.

Additionally or alternatively, the one or more graphical user-interactions may comprise a graphical user-interaction consisting in performing a stroke over the object. The performing of the stroke may consist in a user drawing the stroke on the displayed 3D point cloud, for example with a haptic device by continuously moving a cursor over the object according to a line or with a touch continuously performed over the object according to a line. This graphical user-interaction is for selecting the object, as it pertains to the selection of locations (i.e. those defined by the stroke) over the object.

Additionally or alternatively, the one or more graphical user-interactions may comprise a graphical user-interaction consisting in defining a bounding box over the object and or around the object. Defining the bounding box may in a user drawing the bounding box on the displayed 3D point cloud, for example by continuously moving a touch or a cursor of a haptic device to form the bounding box. This graphical user-interaction is for selecting the object, as it pertains to the selection of locations (i.e. those inside the bounding box) over the object.

Additionally or alternatively, the one or more graphical user-interactions may comprise a graphical user-interaction consisting in performing one or more clicks outside the object. The performing of the one or more clicks may be performed with a haptic device, e.g. the user clicks or touches one or more times the displayed 3D point cloud at one or more locations outside the object. This graphical user-interaction is for discarding a region outside the object, as it pertains to the selection of one or more locations (i.e. those of the one or more clicks) over the region. The one or more locations may for example be on a neighboring region outside the object, to specify the object boundaries. Alternatively, they may be on an a neighboring object, to specify it at as background object.

Additionally or alternatively, the one or more graphical user-interactions may comprise a graphical user-interaction consisting in performing a stroke outside the object. The performing of the stroke may consist in a user drawing the stroke on the displayed 3D point cloud, for example with a haptic device by continuously moving a cursor over the 3D point cloud according to a line or with a touch continuously performed over the 3D point cloud according to a line. This graphical user-interaction is for discarding a region outside the object, as it pertains to the selection of locations (i.e. those defined by the stroke) over the region. The locations may for example be on a neighboring region outside the object, to specify the object boundaries. Alternatively, they may be on an a neighboring object, to specify it as background object.

The one or more graphical user-interactions may complete each other: for example one of them is for roughly selecting the object (e.g. a single click on the object), and another one is for discarding a neighboring region to refine the selection of the object (e.g. a click on a neighboring region of the object). Altogether, the one or more graphical user-interactions form a selection operation of the object. The selection operation is specified by data encapsulating the location(s) defined by the one or more graphical user-interactions. Said otherwise, these data form a specification of the one or more graphical user-interaction. The specification is of the same type of data that the specifications provided in the training dataset, which have been previously discussed. The main difference is that the specification in the context of the segmenting method stems from real graphical user-interactions, whereas in the context of the learning method the specifications may have stemmed from simulated, virtual graphical user-interactions, as previously discussed.

Based on this specification and on the input 3D point cloud, the segmenting method then comprises segmenting the 3D point cloud by applying S50 the neural network. As previously explained, the neural network takes as input the specification and the 3D point cloud and performs operations on these inputs that result in that the neural network extracts the object from the 3D point cloud. For example, the neural network may output a classification of the points of the 3D point cloud as "object" or "not object" with a confidence score, as previously discussed.

At each iteration, the segmenting method may comprise, after the performing of the selection operation and before the applying of the neural network, transforming the selection operation into an interaction channel, which is here, as in examples of the learning method, a set of coordinates each added to a respective point of the 3D point cloud. Transforming the selection operation into an interaction channel comprises:

determining the specification by determining, for each graphical user-interaction of the one or more graphical user-interactions, positions of one or more seed locations defined by the graphical user-interaction; and equipping the 3D point cloud with the specification, the equipping comprising adding to each point of the 3D point cloud a coordinate quantifying an intensity of the selection operation at the point.

Each graphical user-interaction defines a geometry on the 3D point cloud (e.g. one or more clicks, a stroke or a bounding box) and yields data about location of this geometry. These data may be detected by any known method for detecting the position of a graphical user-interaction. The segmenting method determines, from these data, one or more seed locations which altogether represent the geometry. Each seed location are referred to as "seed" as of now, for simplicity. Determining the one or more seeds may comprise computing as the one or more seeds one or more points characteristic of the geometry, which implies that each seed is in this case a point. A seed over the object is referred to as a positive seed and a seed over a region outside the object is referred to as a negative seed. A graphical user-interaction may define both positive and negative seeds.

In examples, if the graphical user-interaction consists in performing one or more clicks, the determining of the one or more seeds may comprise determining each click as a seed. A click over the object is determined as a positive seed, while a click over a region outside the object is determined as a negative seed.

Additionally or alternatively, if the graphical user-interaction consists in performing a stroke, the determining of the one or more seeds may comprise sampling the stroke into a number of points by taking points under the stroke line. The seeds are then the sampled points. The sampled points are positive seeds if they are over the object and negative seeds if they are over a region outside the object. The number of sampled points may be proportional to the length of the stroke. Note that this matches simulated graphical user-interactions in examples of the providing S10 of the training dataset where for positive seeds, the bigger the object is, the bigger a stroke performed over it will likely to be, and the more seeds are determined.

Additionally or alternatively, if the graphical user-interaction consists in defining a bounding box, the determining of the one or more seeds may comprise sampling the bounding box into points inside the bounding box and into points outside the bounding box. The points inside are determined as positive seeds and the points outside are determined as negative seeds. The number of positive seeds may be proportional to the number of points inside the bounding box and chosen randomly between them. The negative seeds can be randomly choose among the points contained in a small region (e.g. inferior to 30 cm) around the bounding box. Note that this matches the simulated graphical user-interaction according to the first strategy discussed for the learning method.

Still discussing the segmenting method, equipping the 3D point cloud with the specification comprises adding to each point of the 3D point cloud a coordinate quantifying an intensity of the selection operation at the point.

As of now, the equipping for the segmenting method is discussed.

The equipping of the 3D point cloud takes into account the determined seed(s) and converts them into a set of coordinates, one coordinate per each point of the 3D point cloud. Equipping the 3D point cloud comprises then adding this coordinate to each point, and this results in the specification. Said otherwise, the specification is the set of all the coordinates added to each point of the 3D point cloud.

The converting is such that for each point, the coordinate quantifies an intensity of the selection operation at the point. Specifically, the coordinate quantifies a closeness of the point to each graphical user-interaction. This quantifies whether the point belongs to the object to select (i.e. said same object) or not. This eventually allows, during the applying S50, the neural network to extract/select, or not, a point as being part of an object, when the neural network performs the segmentation. For example, the neural network detects that, the higher the coordinate is, the greater is the probability of the point to belong to the object to select.

In examples, the adding comprises, setting the coordinate to a same initial value for all points. The adding may then comprise, for each determined positive seed, for each point of the point cloud, increasing the coordinate according to a closeness between the seed and the point. The adding may also comprise, for each determined negative seed, for each point of the point cloud, decreasing the coordinate according to a closeness between the seed and the point.

Increasing (resp. decreasing) the coordinate according to a closeness between a positive (resp. negative) seed and the point may comprise quantifying a distance between the location of the point and the seed. Increasing (resp. decreasing) the coordinate may then comprise adding (resp. subtracting) to the coordinate a value representative of the quantified distance.

It is to be understood that, for any point of the 3D point cloud, if the point is too far from a seed, be it a positive or a negative one, the coordinate of the point is neither increased nor decreased. In other words, for each point and each determined seed, the increasing or decreasing of the coordinate only occur when the point is relatively close to the graphical user-interaction (e.g. within a certain range of distance from the seed). It may thus happen that a point has its coordinate still equal to the initial value after the equipping.

Adding the coordinates in such a manner has the following effect: the more a point is close to a positive seed, the more the point is likely to belong to said same object, and the more its added coordinate has a high value. Conversely, the more a point is close to a negative seed, the more the point is likely to not belong to the object, and the more its added coordinate has a low value. Eventually, this allows the neural network to detect when a graphical user-interaction is for selecting an object, and when it is for discarding a region outside the object.

An implementation of the equipping of the 3D point cloud with the specification is now discussed.

In this implementation, the determining of the specification results in one or more positive seeds and one or more negative seeds. Furthermore, in this implementation, each seed is a point, as previously discussed. This implementation comprises converting the seeds into the specification, which is now referred to as the interaction channel. The converting uses a K-nearest neighbors search to retrieve the K closest points to each seed and assign them a particular intensity based on their distance from each seed.

Specifically, the adding of the coordinate, comprises, for all points of the 3D point cloud, initializing the coordinate with the same value, said same value being equal to 128. The adding of the coordinate then comprises, for each seed, retrieving the K closest points to the seed, for example according to a nearest neighbor search algorithm. Here the number K is the number K previously discussed in relation with formula (1). The retrieving may comprise modulating the number of neighbors used in the K nearest neighbor search according to the number of points of the 3D point cloud. This allows the search to be invariant to the point cloud density. The modulating may be carried out according to the following formula:

$$K = m \times \left\lceil \frac{N \times k}{D \times m} \right\rceil, \quad (3)$$

where D is a default number of points considered, m a degree of modularity chosen and k a default number of neighbors considered.

Experiments have shown that this formula for K proved itself very stable for various point cloud sizes (a range of around 10 k to 500 k points was tested with D=100000, k=1024 and m=128 for a region of 3*3*5 meters).

The adding of the coordinate comprises then, for each seed and each point of the 3D point cloud that belongs to the K neighbors of the seed, modifying the coordinate by:
  adding to the coordinate a Gaussian intensity from the seed if the seed is a first seed, or
  subtracting from the coordinate a Gaussian intensity from the seed if the seed is a second seed.

The modifying may in fact comprise, for each seed, computing the Gaussian intensity and dynamically modulating it based on the median distance of the K distances of the K closest points to the seed. The computing of the Gaussian intensity for a first seed, also referred to as positive seed, may be carried out according to the formula:

$$\text{interactionIntensity}(\text{distFromPositiveSeed}, s) = 127 * e^{-0.5 * ((\text{distFromPositiveSeed}/s)^2)},$$

where $s = \text{median}(\text{arrayOfNeighborsDistances})$, $s \in \mathbb{R}$, where $\text{arrayOfNeighborsDistances} \in \mathbb{R}^2$ contains the distances from the positive seed for each neighbor and has a size of (K,1), and where K is the number of nearest neighbors.

The computing of the Gaussian intensity for a second seed, also referred to as negative seed, may be carried out according to the formula:

$$\text{interactionIntensity}(\text{distFromNegativeSeed}, s) = 127 * e^{-0.5 * ((\text{distFromNegativeSeed}/s)^2)},$$

where $s = \text{median}(\text{arrayOfNeighborsDistances})$, $s \in \mathbb{R}$, where $\text{arrayOfNeighborsDistances} \in \mathbb{R}^2$ contains the distances from the negative seed for each neighbor and has a size of (K,1), and where K is the number of nearest neighbors.

It is to be noted that the coordinate is initialized at 128 for all points. The multiplication of the Gaussian intensity by 127 allows having a maximum value of 255 for the points matching positive seeds. For those matching negative seeds, the corresponding final point intensity is 1. Therefore the intensity covers the same amplitude as the color channels and allows further simple normalization step (normalization between 0-1 for each channel by dividing by 255), should the point clouds be equipped each with a color channel. The dynamic s parameter as the median value of the array of the neighbors' distances offers some flexibility to work with different point cloud densities. Contributions from all the points matching a seed are added and the equipping comprises clipping the coordinate, belonging to [0, 255], and concatenating it to the other coordinates of the point, and this for each point. The interaction channel/specification is the set of all the concatenated coordinates. For example, for a 3D point cloud of N points with the coordinates xyz as the only features, the equipping results in a (N, 3+1) final point cloud dimension. If the colors are present, the equipping results in a (N, 6+1) dimension, etc. In conducted experiments, taking only point coordinates, i.e. and not colors, showed great results.

As a result, in this implementation, the 3D point cloud is equipped with an interaction channel. The pair made of the 3D point cloud and its interaction channel is then fed as input to the neural network for performing the segmentation.

Prior to that, this implementation may comprise, in a particular implementation of this implementation, cropping the point cloud around the centroids of the positive seeds. Having this region instead of the entire point clout reduces the time to run. This particular implementation may also comprise a uniform sampling to duplicate points in low density region of the point clouds. This particular implementation may also comprise dividing the points of the 3D point cloud into sets of 2048 points to match the input size of PointCNN, which is the neural network in this particular implementation. In this particular implementation, the neural network then outputs predictions for these points, as previously discussed. The segmenting method may comprise merging the predictions based on the confidence scores of the network. The segmenting method may also optionally comprise a post-processing to smooth the predictions that can appear to be relatively sparse. The smoothing may use a voxel-based approach that relies on the confidence scores outputted by the neural network. In each voxel, the smoothing compares the means confidence for the object category across all the points it contains to a fixed threshold. It allows to state about the voxel category and to label all the points it contains accordingly. One advantage of such method of post-processing is its time efficiency.

An example of an experiment of the segmenting method is now discussed.

In this experiment, the neural network is learnt according to an example the learning method. The training dataset used for the learning is made of synthetic point clouds, as previously discussed. In the example of the learning method according to which the neural network is learnt, the learning method comprises the previously-discussed implementation of the equipping of the 3D point cloud for the learning method. The experiment comprises then several implementations of the segmenting method.

Figure 6:
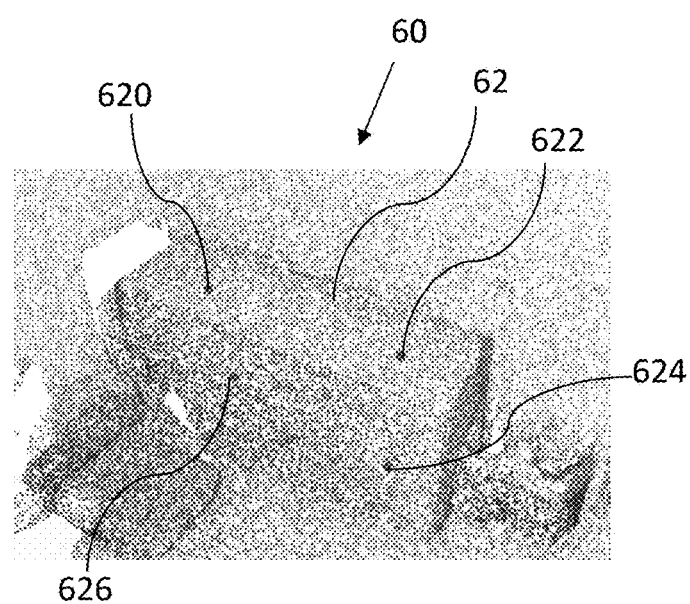
Figure 7:
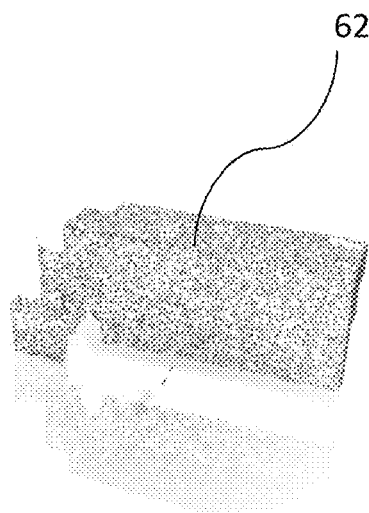

A first implementation is illustrated by FIGS. 6 and 7. As shown in FIG. 6, a 3D point cloud 60 comprising an object 62 is displayed to a user. The user performs several clicks 620, 622, 624 and 626 over object 62, each click resulting in a positive seed. By applying S50 the neural network, object 62 is extracted, as shown in FIG. 7.

Figure 8:
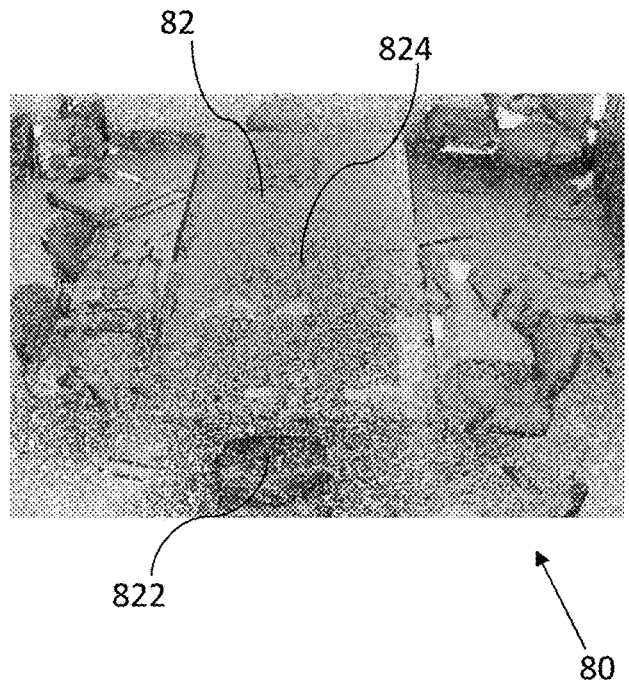
Figure 9:
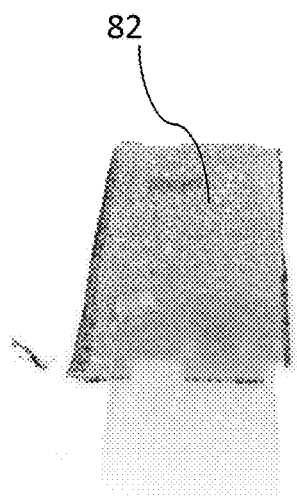

A second implementation is illustrated by FIGS. 8 and 9. As shown in FIG. 8, a 3D point cloud 80 comprising an object 82 is displayed to a user. The user performs several clicks 824 and 822 over point cloud 80. Click 822 results in a negative seed and click 824 results in a positive seed. By applying S50 the neural network, object 82 is extracted, as shown in FIG. 9.

Figure 10:
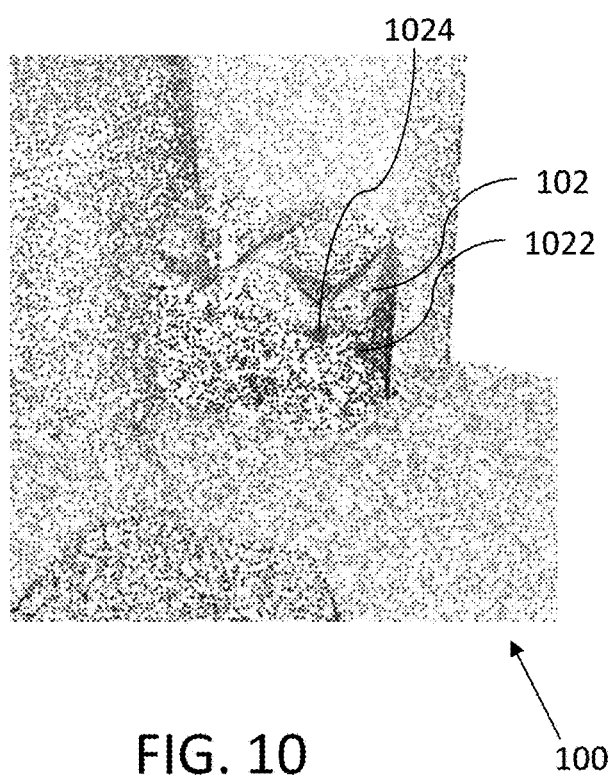
Figure 11:
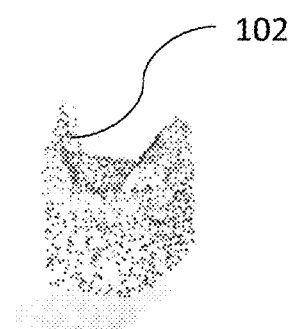

A third implementation is illustrated by FIGS. 10 and 11. As shown in FIG. 10, a 3D point cloud 100 comprising an object 102 is displayed to a user. The user performs several clicks 1022 and 1024 over object 102, each click resulting in a positive seed. By applying S50 the neural network, object 102 is extracted, as shown in FIG. 11.

Figures 12, 13:
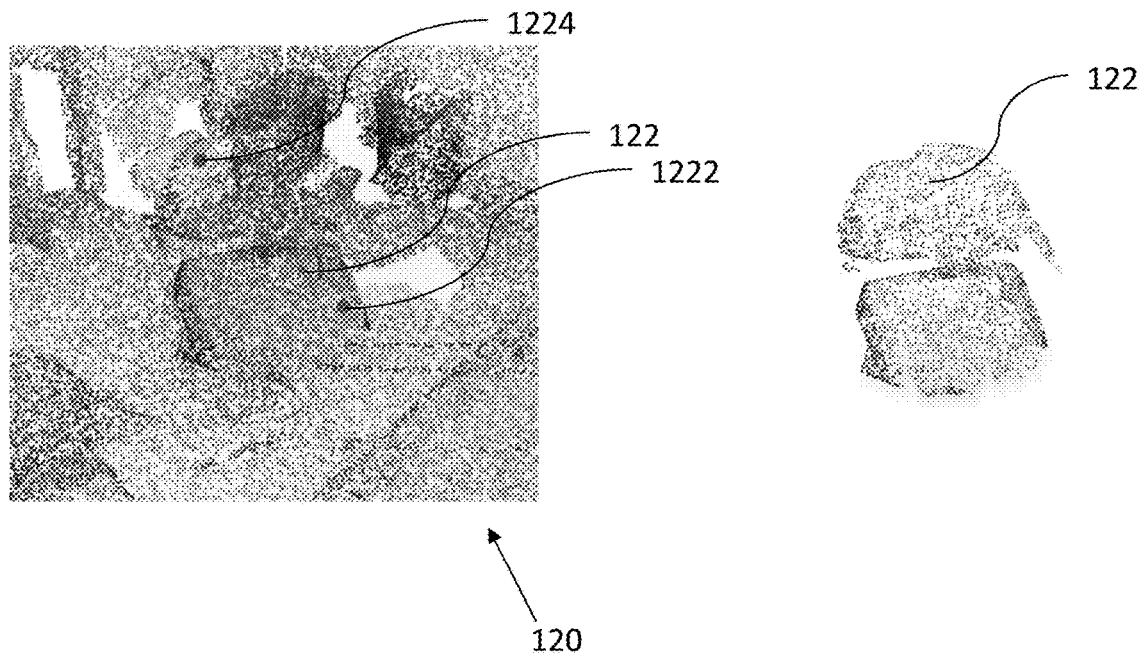

A fourth implementation is illustrated by FIGS. 12 and 13. As shown in FIG. 12, a 3D point cloud 120 comprising an object 122 is displayed to a user. The user performs several clicks 1222 and 1224 over object 122, each click resulting in a positive seed. By applying S50 the neural network, object 122 is extracted, as shown in FIG. 13.

Figure 14:
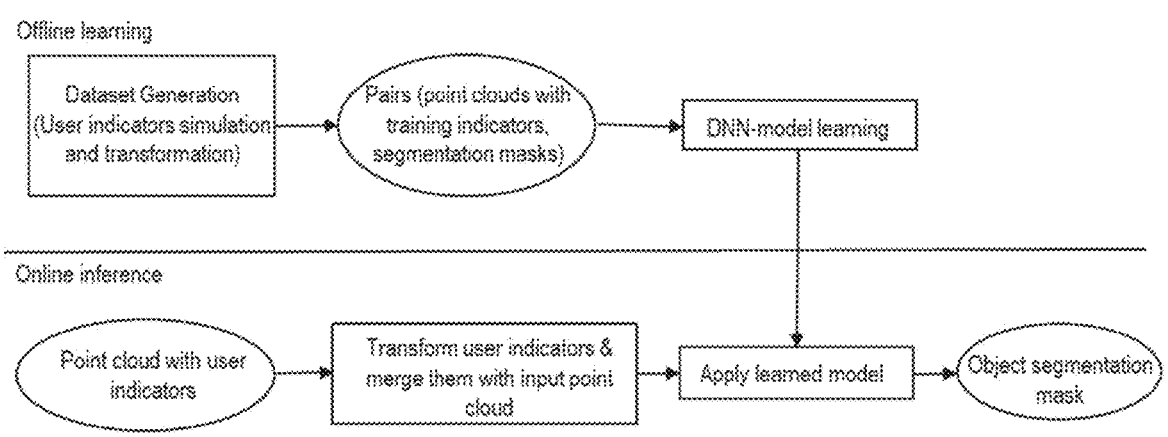

FIG. 14 shows a flowchart of an example the process integrating the learning method and the segmenting method. As shown in FIG. 14, the example of process performs the following steps:

1. Offline stage: this stage aims at training a model using point clouds with pairs of users' indicators/segmentation masks that are supposed to be close from real world data and user behaviors. It contains two main steps. Note that this stage is transparent from the user.
   1) The training dataset generation.
      i. Giving point clouds, collecting coherent indicators from real users can be very hard and time-consuming with no guarantee of covering different user behaviors. In this example, the training indicators are automatically generated by defining user like behaviors. The training user indicators include:
         Positive training indicator which consists in at least one point of the training point cloud, which is part of an identified target object in the same point cloud.
         Negative training indicator which consists in at least one background point of the training point cloud, which is not part of an identified target object in the same point cloud.
         Note that at least one positive indicator must be generated per target object.
      ii. The generated indicators are transformed into an additional channel (i.e. interaction channel) which is added to the original point clouds as input the neural network transformed into a format that can be input to a neural network. Then, the resulting training dataset includes both enriched point clouds with training indicators and segmentation masks of target objects.
   2) A neural network model is learned based on the training dataset. It consists on a point cloud DNN-based model.
2. Online stage: given a point cloud and user indicators, the data is first pre-processed to transform the indicators. Then, the trained model is applied to finally get the segmentation mask.

Figure 15:
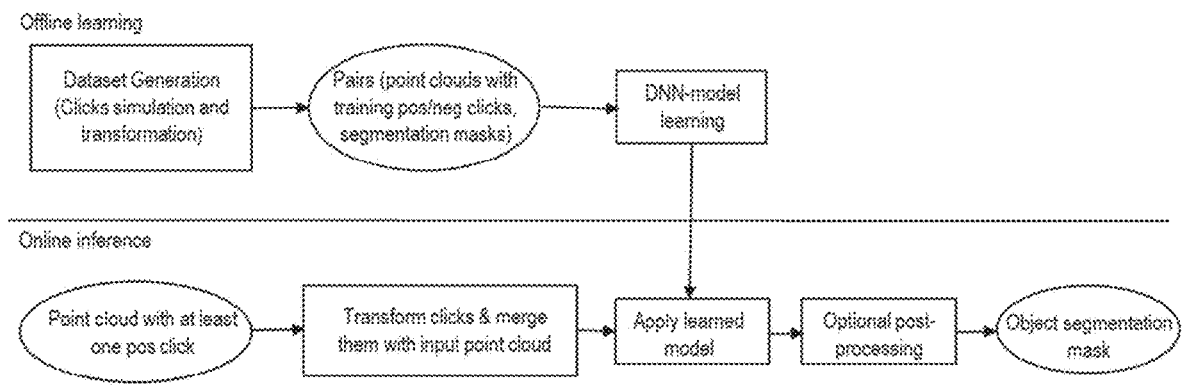

FIG. 15 shows a flowchart of an implementation of the process.

The learning method and the segmenting method are computer-implemented methods.

This means that steps (or substantially all the steps) of the methods are executed by at least one computer, or any system alike. Thus, steps of the methods are performed by the computer, possibly fully automatically, or, semi-automatically. In examples, the triggering of at least some of the steps of the methods may be performed through user-computer interaction. The level of user-computer interaction required may depend on the level of automatism foreseen and put in balance with the need to implement user's wishes. In examples, this level may be user-defined and/or pre-defined.

A typical example of computer-implementation of a method is to perform the methods with a system adapted for this purpose. The system may comprise a processor coupled to a memory and a graphical user interface (GUI), the memory having recorded thereon a computer program comprising instructions for performing the methods. The memory may also store a database. The memory is any hardware adapted for such storage, possibly comprising several physical distinct parts (e.g. one for the program, and possibly one for the database).

Figure 16:
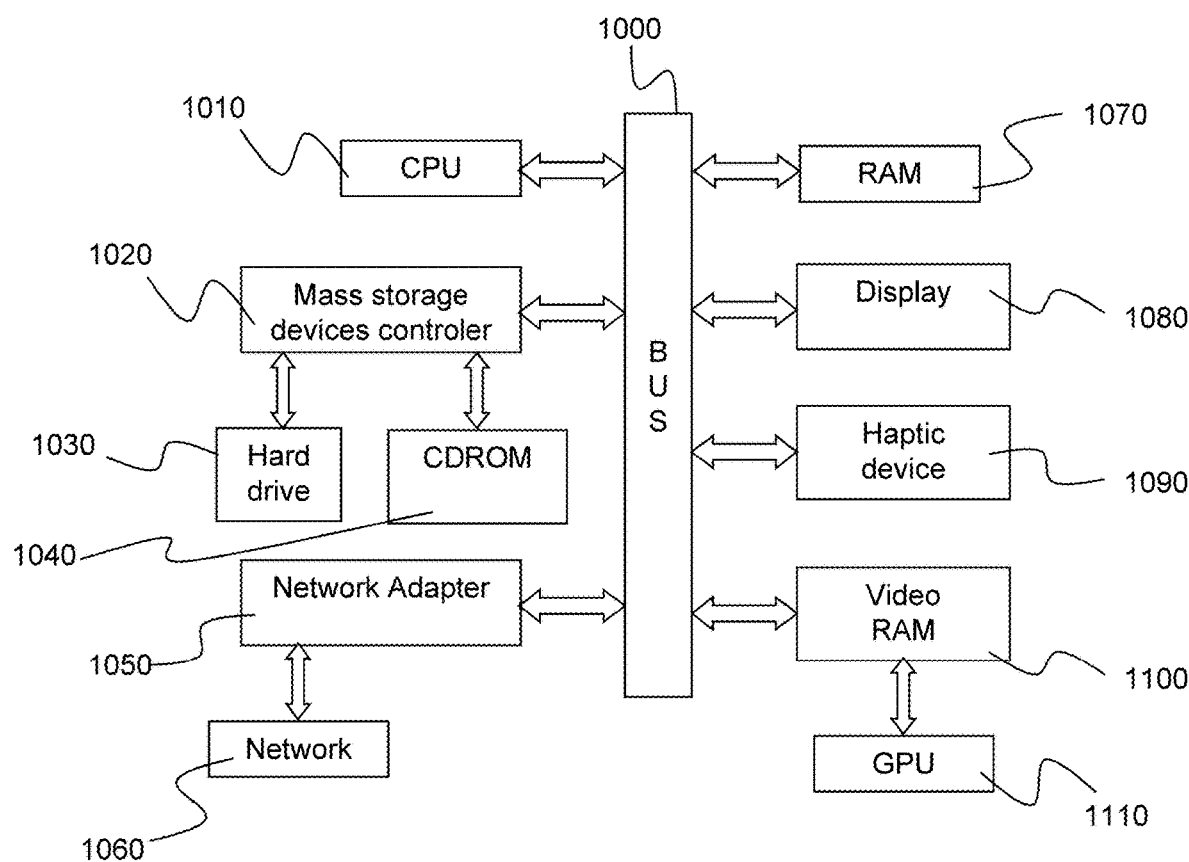
FIG. 16 shows an example of the system.

FIG. 16 shows an example of the system, wherein the system is a client computer system, e.g. a workstation of a user.

The client computer of the example comprises a central processing unit (CPU) 1010 connected to an internal communication BUS 1000, a random access memory (RAM) 1070 also connected to the BUS. The client computer is further provided with a graphical processing unit (GPU) 1110 which is associated with a video random access memory 1100 connected to the BUS. Video RAM 1100 is also known in the art as frame buffer. A mass storage device controller 1020 manages accesses to a mass memory device, such as hard drive 1030. Mass memory devices suitable for tangibly embodying computer program instructions and data include all forms of nonvolatile memory, including by way of example semiconductor memory devices, such as EPROM, EEPROM, and flash memory devices; magnetic disks such as internal hard disks and removable disks; magneto-optical disks; and CD-ROM disks 1040. Any of the foregoing may be supplemented by, or incorporated in, specially designed ASICs (application-specific integrated circuits). A network adapter 1050 manages accesses to a network 1060. The client computer may also include a haptic device 1090 such as cursor control device, a keyboard or the like. A cursor control device is used in the client computer to permit the user to selectively position a cursor at any desired location on display 1080. In addition, the cursor control device allows the user to select various commands, and input control signals. The cursor control device includes a number of signal generation devices for input control signals to system. Typically, a cursor control device may be a mouse, the button of the mouse being used to generate the signals. Alternatively or additionally, the client computer system may comprise a sensitive pad, and/or a sensitive screen.

Any computer program herein may comprise instructions executable by a computer, the instructions comprising means for causing the above system to perform one or more of the methods. The program may be recordable on any data storage medium, including the memory of the system. The program may for example be implemented in digital electronic circuitry, or in computer hardware, firmware, software, or in combinations of them. The program may be implemented as an apparatus, for example a product tangibly embodied in a machine-readable storage device for execution by a programmable processor. Method steps may be performed by a programmable processor executing a program of instructions to perform functions of the methods by operating on input data and generating output. The processor may thus be programmable and coupled to receive data and instructions from, and to transmit data and instructions to, a data storage system, at least one input device, and at least one output device. The application program may be implemented in a high-level procedural or object-oriented programming language, or in assembly or machine language if desired. In any case, the language may be a compiled or interpreted language. The program may be a full installation program or an update program. Application of the program on the system results in any case in instructions for performing one or more of the methods.

The invention claimed is:

1. A computer-implemented method of machine-learning, the method comprising:
   obtaining a dataset of 3D point clouds, each 3D point cloud including at least one object, each 3D point cloud being equipped with a specification of one or more graphical user-interactions each representing a respective selection operation of a same object in the 3D point cloud; and
   teaching, based on the dataset, a neural network configured for segmenting an input 3D point cloud including an object, the segmenting being based on the input 3D point cloud and on a specification of one or more input graphical user-interactions each representing a respective selection operation of the object in the 3D point cloud,
   wherein the obtaining of the dataset of 3D point clouds further includes:
   obtaining the 3D point clouds and, for each 3D point cloud, information about location of said same object in the 3D point cloud, and
   for each 3D point cloud:
      determining the specification by simulating each graphical user-interaction of the one or more graphical user-interactions, and
      equipping the 3D point cloud with the specification of the one or more graphical user-interactions.

2. The method of claim 1, wherein each graphical user-interaction of the one or more graphical user-interactions corresponds to one or more seed locations each defined over the 3D point cloud, and the simulating of the graphical user-interaction further includes determining the one or more seed locations.

3. The method of claim 2, wherein the one or more graphical user-interactions include a first graphical user-interaction for selecting said same object and corresponding to one or more first seed locations each defined over said same object.

4. The method of claim 3, wherein the determining of the one or more seed locations includes spreading the one or more first seed locations over said same object.

5. The method of claim 3, wherein for at least one 3D point cloud, the one of more graphical user-interactions further include a second graphical user-interaction for discarding a region outside of said same object and corresponding to one or more second seed locations each defined outside said same object.

6. The method of claim 1, wherein the equipping of the 3D point cloud includes, based on the simulating of each graphical user-interaction, adding to each point of the 3D point cloud a coordinate quantifying an intensity of the selection operation at the point.

7. The method of claim 6, wherein each graphical user interaction of the one or more graphical user-interactions is for selecting said same object or for discarding a region outside of said same object, and for each point of the 3D point cloud the adding of the coordinate includes:

setting the coordinate to an initial value,
for each graphical user-interaction for selecting said same object, increasing the coordinate according to a closeness between the graphical user-interaction and the point, and
for each graphical user-interaction for discarding a region outside of said same object, decreasing the coordinate according to a closeness between the graphical user-interaction and the point.

8. A computer-implemented method of applying a neural network teachable by obtaining a dataset of 3D point clouds, each 3D point cloud including at least one object, each 3D point cloud being equipped with a specification of one or more graphical user-interactions each representing a respective selection operation of a same object in the 3D point cloud, and teaching, based on the dataset, a neural network configured for segmenting an input 3D point cloud including an object, the segmenting being based on the input 3D point cloud and on a specification of one or more input graphical user-interactions each representing a respective selection operation of the object in the 3D point cloud, the method comprising:
   obtaining a 3D point cloud including an object; and
   one or more iterations of:
   performing a selection operation of the object by performing one or more graphical user-interactions, and
   by applying the neural network, segmenting the 3D point cloud based on the 3D point cloud and on a specification of the one or more graphical user-interactions,
   wherein the obtaining of the dataset of 3D point clouds further includes:
   obtaining the 3D point clouds and, for each 3D point cloud, information about location of said same object in the 3D point cloud, and
   for each 3D point cloud:
      determining the specification by simulating each graphical user-interaction of the one or more graphical user-interactions, and
      equipping the 3D point cloud with the specification of the one or more graphical user-interactions.

9. The method of claim 8, further comprising, after the performing of the selection operation and before the applying of the neural network:
   determining the specification by determining, for each graphical user-interaction of the one or more graphical user-interactions, positions of one or more seed locations defined by the graphical user-interaction; and
   equipping the 3D point cloud with the specification, the equipping including adding to each point of the 3D point cloud a coordinate quantifying an intensity of the selection operation at the point.

10. The method of claim 8, wherein the one or more graphical user-interactions include one or more of:
   performing one or more clicks over the object,
   performing a stroke over the object,
   defining a bounding box over an object and/or around the object,
   performing one or more clicks outside the object, and/or
   performing a stroke outside the object.

11. A device comprising:
   a processor; and
   a non-transitory data storage medium having recorded thereon a neural network and a computer program, wherein the non-transitory data storage medium includes instructions that when executed by the processor causes the processor to be configured to:
obtain a 3D point cloud including an object, and
in one or more iterations:
  perform a selection operation of the object by performing one or more graphical user-interactions, and
  by applying the neural network, segment the 3D point cloud based on the 3D point cloud and on a specification of the one or more graphical user-interactions, and/or
wherein the non-transitory data storage medium includes instructions that when executed by the processor causes the processor to be configured to:
teach by machine-learning the neural network by the processor being further configured to:
  obtain a dataset of 3D point clouds, each 3D point cloud including at least one object, each 3D point cloud being equipped with a specification of one or more graphical user-interactions each representing a respective selection operation of a same object in the 3D point cloud, and
  teach, based on the dataset, a neural network configured for segmenting an input 3D point cloud including an object, the segmenting being based on the input 3D point cloud and on a specification of one or more input graphical user-interactions each representing a respective selection operation of the object in the 3D point cloud,
wherein in the machine-learning, the processor is further configured to obtain the dataset of 3D point clouds by being configured to
obtain the 3D point clouds and, for each 3D point cloud, information about location of said same object in the 3D point cloud; and
for each 3D point cloud:
  determine the specification by simulating each graphical user-interaction of the one or more graphical user-interactions, and
  equip the 3D point cloud with the specification of the one or more graphical user-interactions.

12. The device of claim 11, wherein in the machine-learning, each graphical user-interaction of the one or more graphical user-interactions corresponds to one or more seed locations each defined over the 3D point cloud, and the simulating of the graphical user-interaction includes the processor being further configured to determine the one or more seed locations.

13. The device of claim 12, wherein in the machine-learning, the one or more graphical user-interactions include a first graphical user-interaction for selecting said same object and corresponding to one or more first seed locations each defined over said same object.

14. The device of claim 13, wherein in the machine-learning, the processor is further configured to determine the one or more seed locations by being further configured to spread the one or more first seed locations over a same object.

15. A non-transitory computer readable medium having stored thereon a program that when executed by a processor causes the processor to implement the method of machine-learning according to claim 1.

16. A non-transitory computer readable medium having stored thereon a program that when executed by a processor causes the processor to implement the method of applying the neural network according to claim 8.

* * * * *